US011868047B2

(12) United States Patent
Liao et al.

(10) Patent No.: US 11,868,047 B2
(45) Date of Patent: Jan. 9, 2024

(54) POLYMER LAYER IN SEMICONDUCTOR DEVICE AND METHOD OF MANUFACTURE

(71) Applicant: Taiwan Semiconductor Manufacturing Co., Ltd., Hsinchu (TW)

(72) Inventors: Sih-Hao Liao, New Taipei (TW); Yu-Hsiang Hu, Hsinchu (TW); Hung-Jui Kuo, Hsinchu (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 499 days.

(21) Appl. No.: 17/026,667

(22) Filed: Sep. 21, 2020

(65) Prior Publication Data
US 2022/0091505 A1 Mar. 24, 2022

(51) Int. Cl.
*G03F 7/031* (2006.01)
*C08G 73/10* (2006.01)
*G03F 7/038* (2006.01)
*G03F 7/039* (2006.01)
*H01L 21/48* (2006.01)
*H01L 23/31* (2006.01)
*H01L 23/498* (2006.01)
*H01L 23/538* (2006.01)
*H01L 23/00* (2006.01)
*H01L 25/18* (2023.01)
*H01L 21/56* (2006.01)

(52) U.S. Cl.
CPC ......... *G03F 7/031* (2013.01); *C08G 73/1067* (2013.01); *C08G 73/1071* (2013.01); *G03F 7/039* (2013.01); *G03F 7/0387* (2013.01); *H01L 21/481* (2013.01); *H01L 21/4857* (2013.01); *H01L 23/3128* (2013.01); *H01L 23/49822* (2013.01); *H01L 23/49894* (2013.01); *H01L 23/5389* (2013.01); *H01L 24/24* (2013.01); *H01L 24/82* (2013.01); *H01L 25/18* (2013.01); *H01L 21/561* (2013.01); *H01L 2224/24137* (2013.01); *H01L 2224/82101* (2013.01)

(58) Field of Classification Search
CPC ......... H01L 24/24; H01L 24/18; H01L 24/82; H01L 23/3128; H01L 23/49822; H01L 23/49894; H01L 23/5389; C08G 73/1071; C08G 73/1067; G03F 7/031; G03F 7/0387; G03F 7/039
See application file for complete search history.

(56) References Cited

U.S. PATENT DOCUMENTS

| 8,361,842 | B2 | 1/2013 | Yu et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |

(Continued)

Primary Examiner — Alonzo Chambliss
(74) Attorney, Agent, or Firm — Slater Matsil, LLP

(57) ABSTRACT

A method of manufacturing a semiconductor device includes applying a polymer mixture over a substrate, exposing and developing at least a portion of the polymer mixture to form a developed dielectric, and curing the developed dielectric to form a dielectric layer. The polymer mixture includes a polymer precursor, a photosensitizer, and a solvent. The polymer precursor may be a polyamic acid ester.

20 Claims, 31 Drawing Sheets

(56) References Cited

U.S. PATENT DOCUMENTS

| | | |
|---|---|---|
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,658,199 B2 | 5/2020 | Liao et al. |
| 11,454,888 B2 * | 9/2022 | Liao .................. G03F 7/031 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2018/0064669 A1 * | 3/2018 | Tengler ............ A61K 9/0056 |

\* cited by examiner

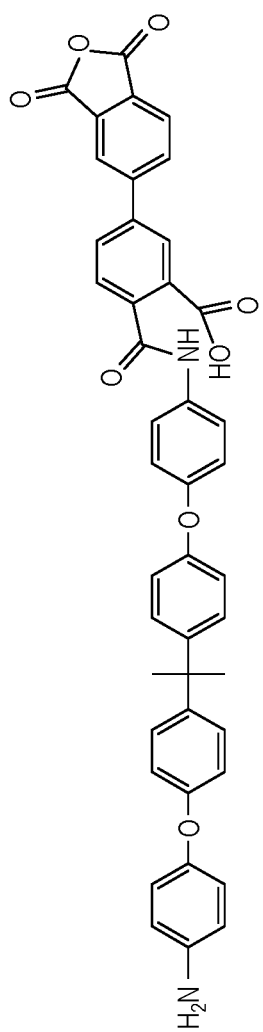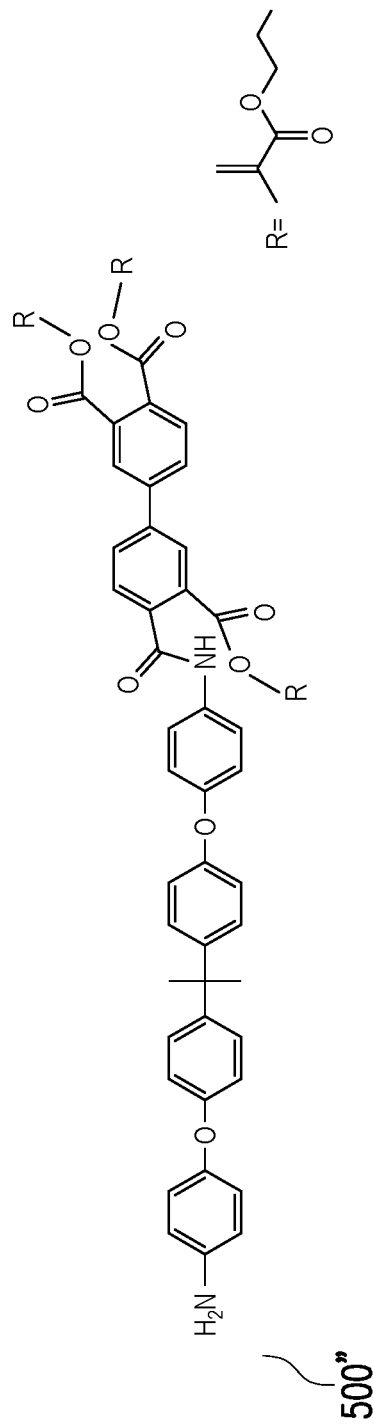
FIG. 9C
FIG. 9D

POLYMER LAYER IN SEMICONDUCTOR DEVICE AND METHOD OF MANUFACTURE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-9D further illustrate the formation of the dielectric layer in accordance with some embodiments.

DETAILED DESCRIPTION

Figure 1:
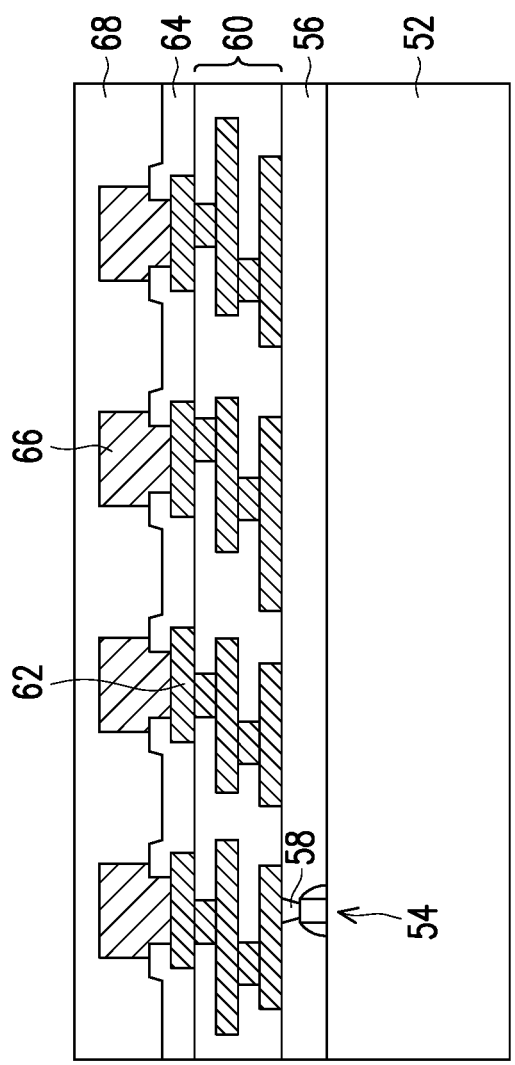
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which a polyimide material is utilized to form dielectric layers within a semiconductor device. The embodiments described, however, are not intended to be limited to the embodiments described herein, and may be utilized in a wide variety of embodiments.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 20 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
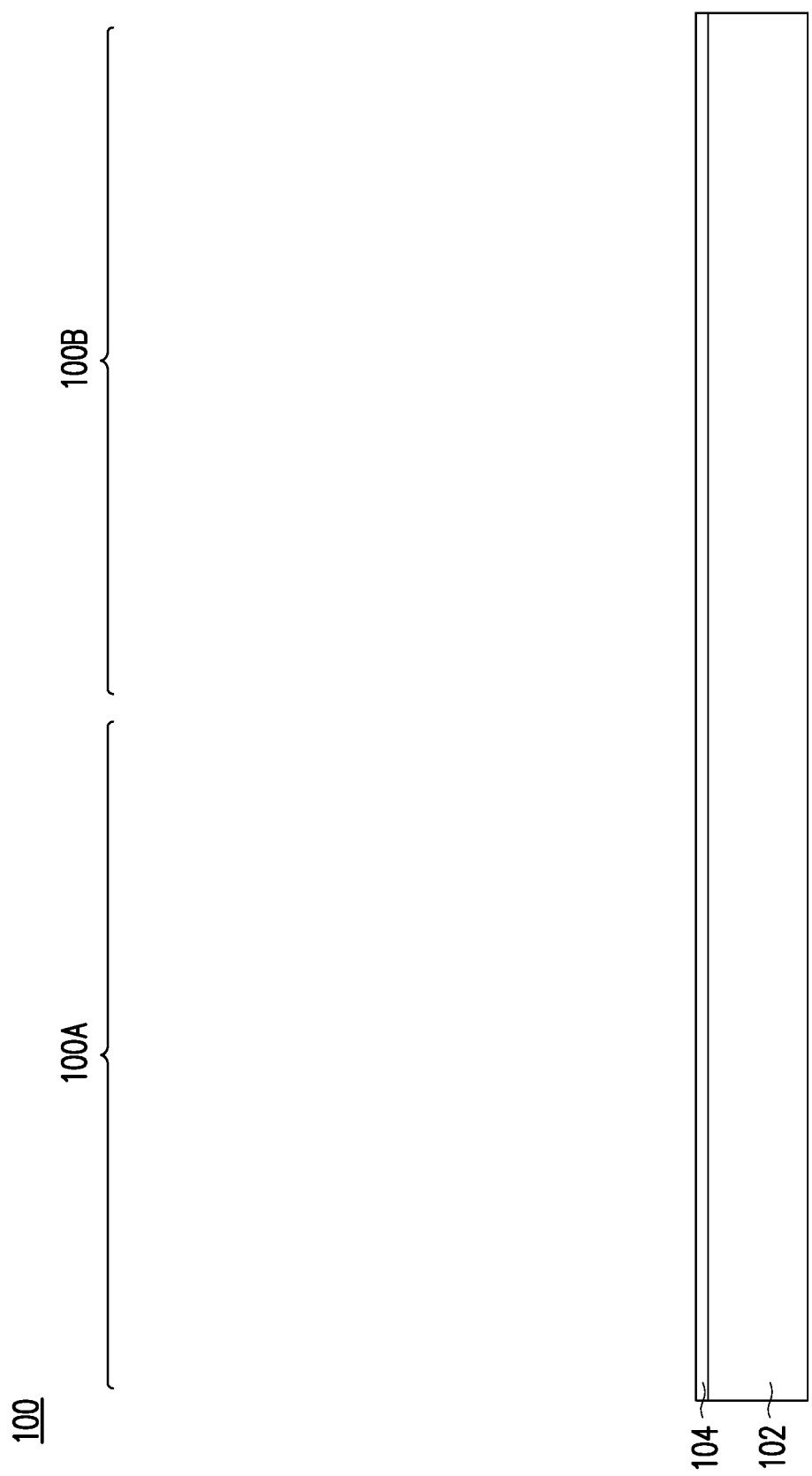
FIGS. 2 through 7 illustrate cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
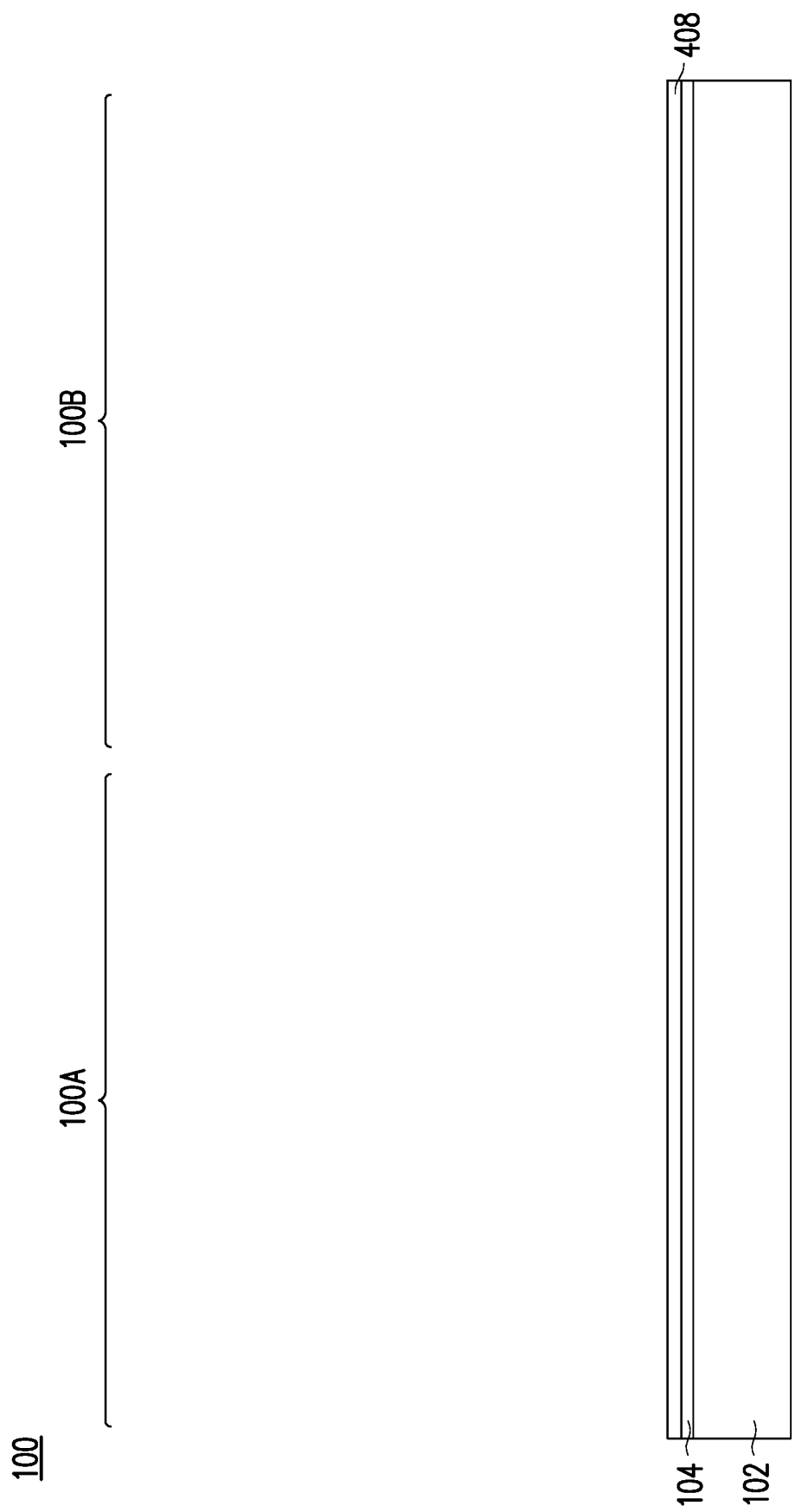

In FIG. 3, a dielectric layer 408 may be formed on the release layer 104. The bottom surface of the dielectric layer 408 may be in contact with the top surface of the release layer 104. In some embodiments, the dielectric layer 408 is formed of a polymer, such as polybenzoxazole (PBO), polyimide, benzocyclobutene (BCB), or the like. In other embodiments, the dielectric layer 408 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 408 may be formed by any acceptable deposition process, such as spin coating, CVD, laminating, the like, or a combination thereof.

Figure 4:
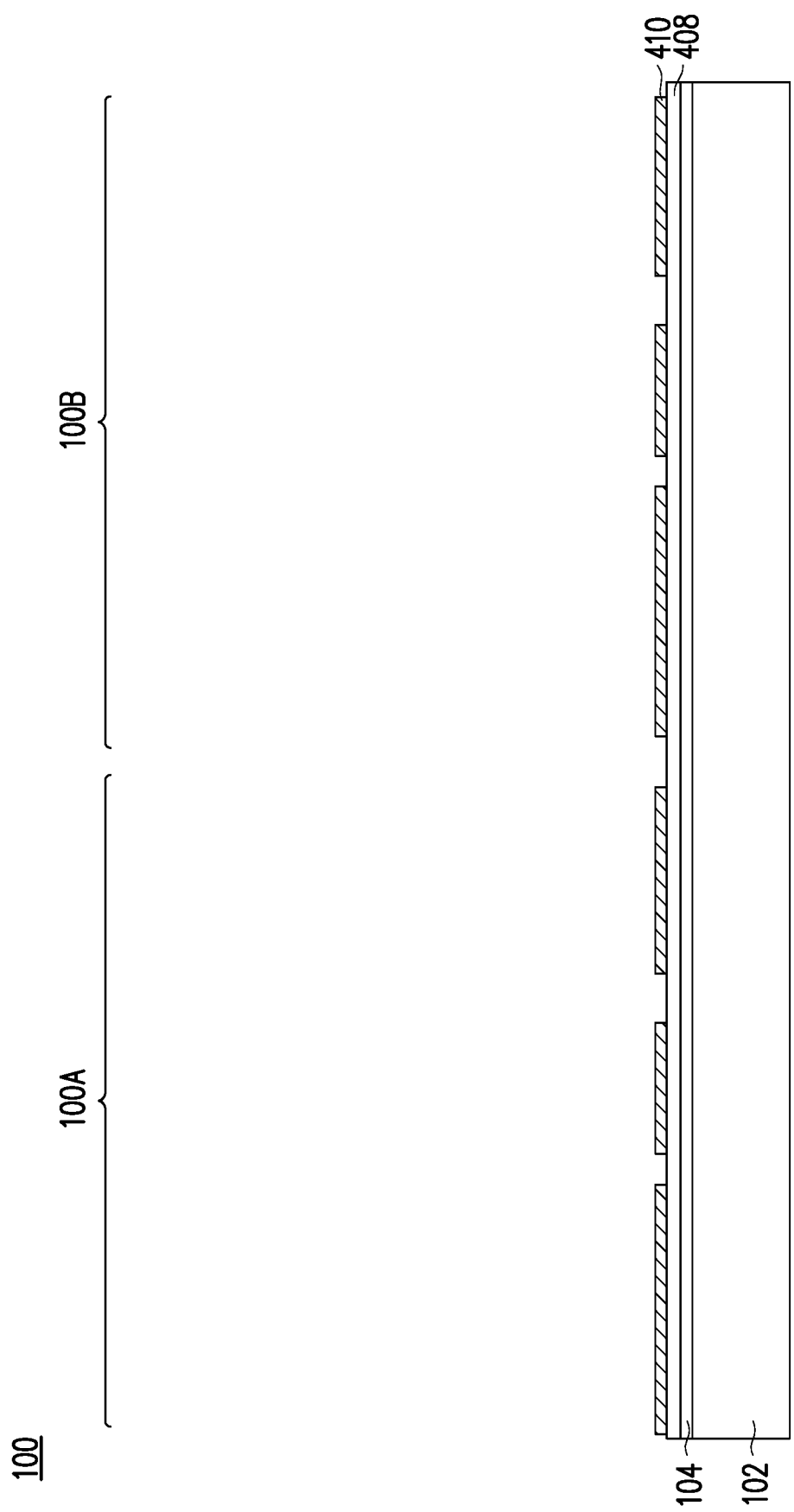

In FIG. 4, a metallization pattern 410 may be formed on the dielectric layer 408. As an example to form metallization pattern 410, a seed layer is formed over the dielectric layer 408. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 410. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 410.

In some embodiments, dies (not illustrated) such as e.g. integrated circuit dies are attached to the dielectric layer 408 and/or the metallization pattern 410. The dies may be substantially similar to the integrated circuit dies 50 described below with respect to FIG. 14. The dies may be attached to the dielectric layer 408 and/or the metallization pattern 410 as the method described below with respect to FIG. 14 for the integrated circuit dies 50.

Figure 5:
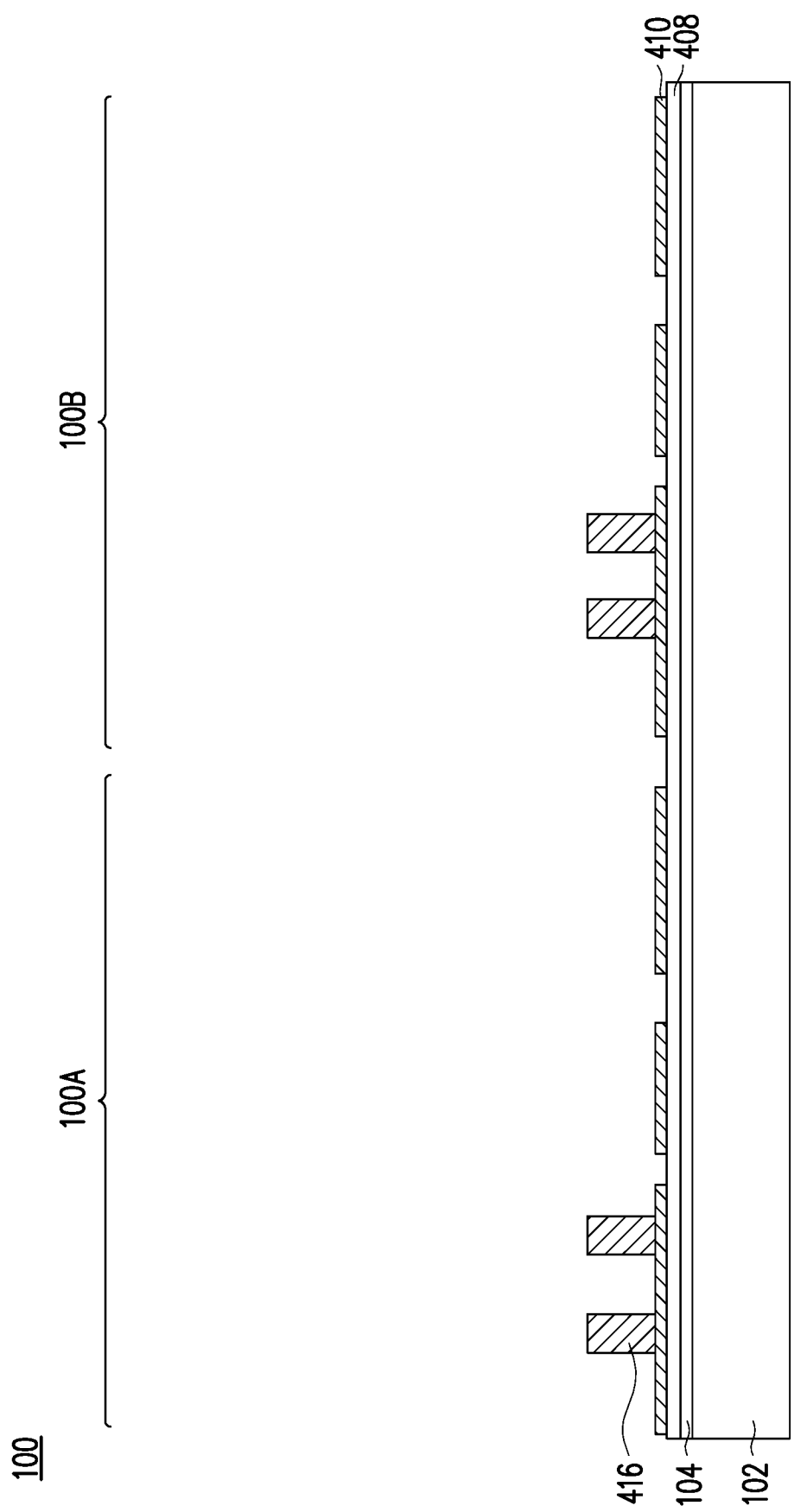

In FIG. 5, through vias 416 are formed on the metallization pattern 410. As an example to form the through vias 116, a photoresist is formed and patterned on the metallization pattern 410. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the metallization pattern 410, forming the through vias 416. The conductive material may be formed by plating, such as electroplating or electroless plating, or the like. The conductive material may comprise a metal, like copper, titanium, tungsten, aluminum, or the like. The photoresist is removed, such as by an acceptable ashing or stripping process, such as using an oxygen plasma or the like.

Figure 6:
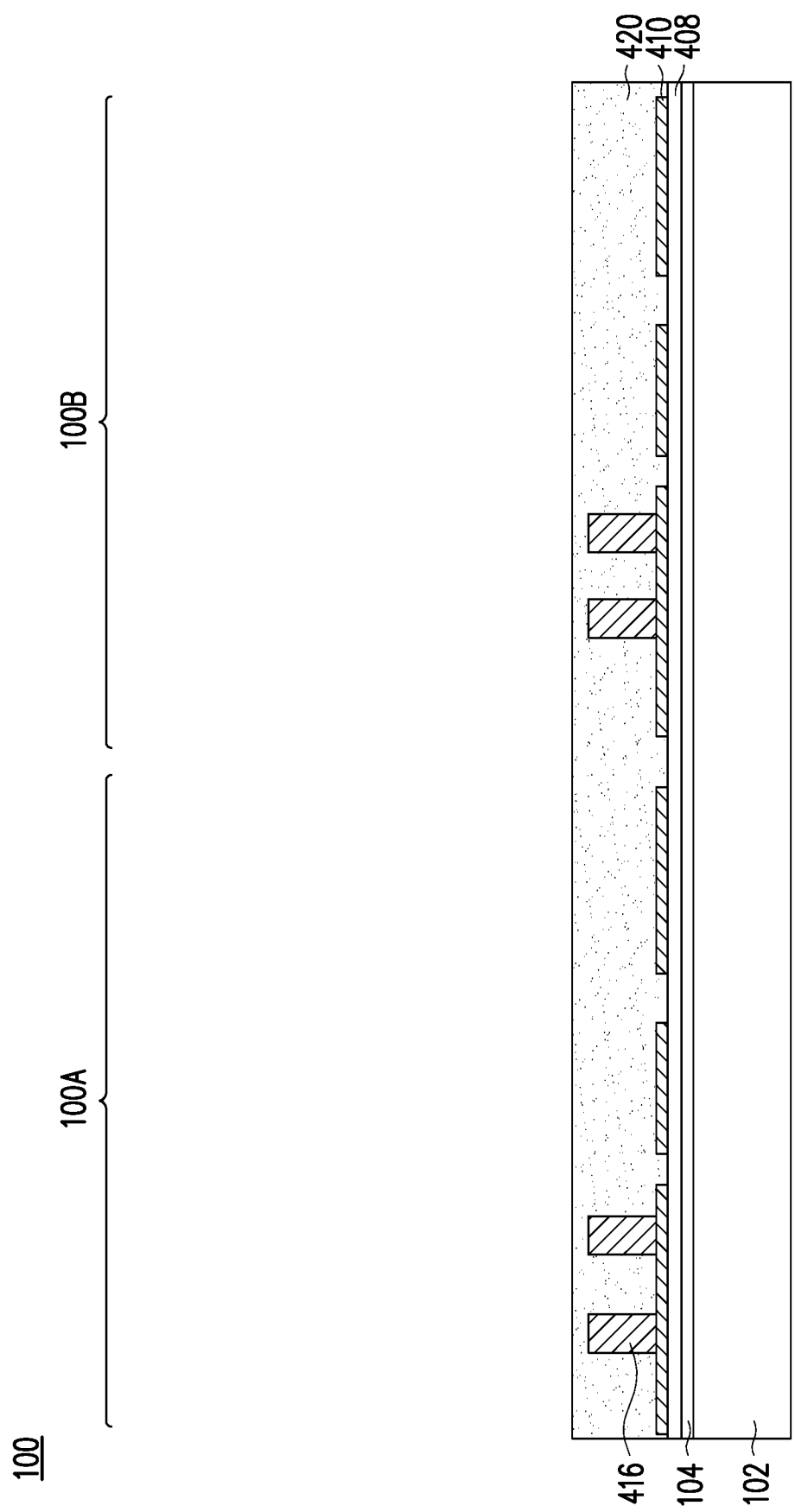

In FIG. 6, an encapsulant 420 is formed on and around the various components. After formation, the encapsulant 420 encapsulates the through vias 416. The encapsulant 420 may be a molding compound, epoxy, or the like. The encapsulant 420 may be applied by compression molding, transfer molding, or the like, and may be formed over the carrier substrate 102 such that the through vias 416 are buried or covered. The encapsulant 420 is further formed over the metallization pattern 410 and may extend to cover portions of the dielectric layer 408. In some embodiments, the encapsulant 420 further encapsulates dies (not illustrated) attached to the dielectric layer 408 and/or the metallization pattern 410. The encapsulant 420 may be applied in liquid or semi-liquid form and then subsequently cured.

Figure 7:
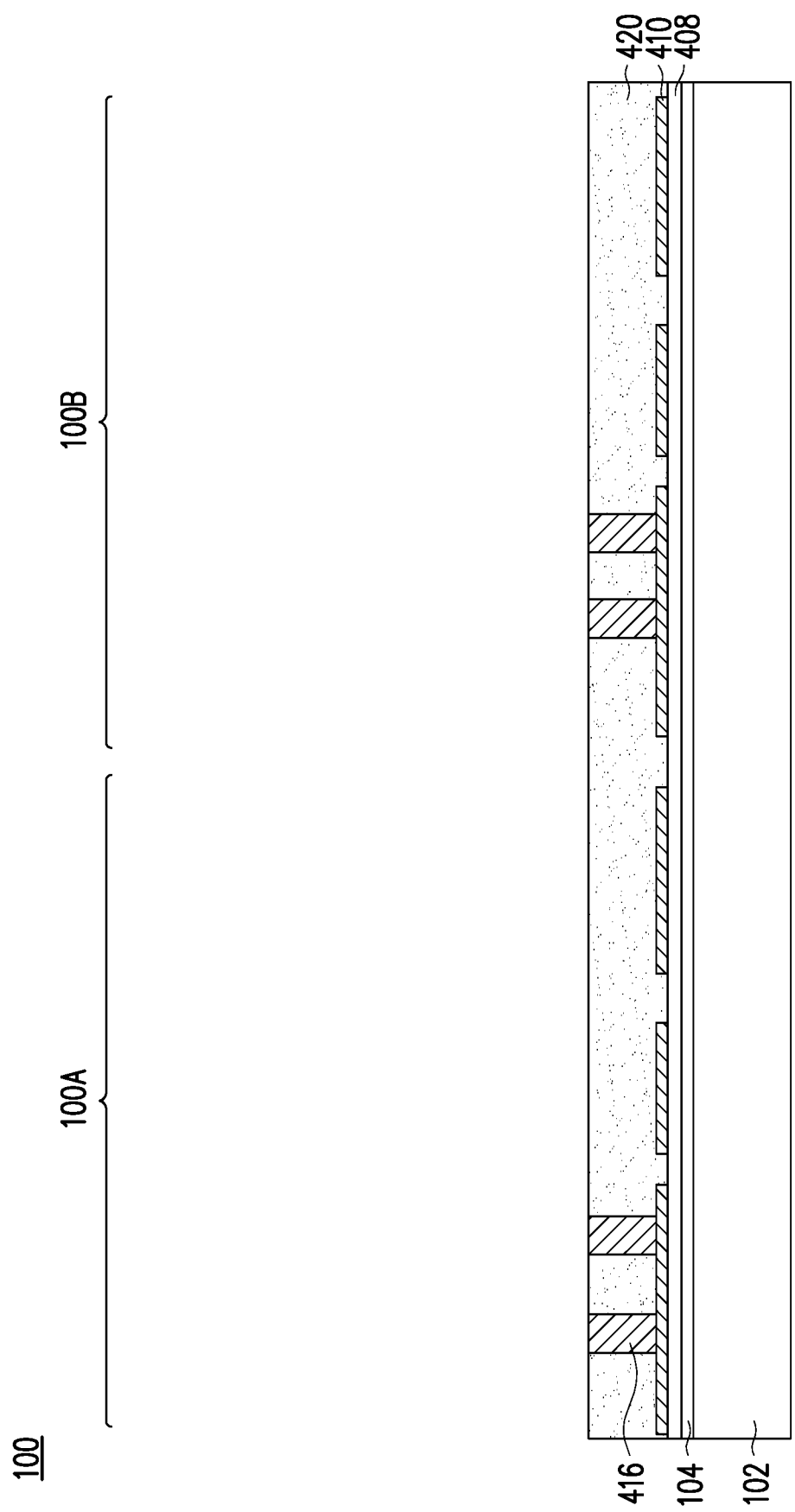

In FIG. 7, a planarization process is performed on the encapsulant 420 to expose the through vias 416. The planarization process may also remove material of the through vias 416. Top surfaces of the through vias 416 and encapsulant 420 are substantially coplanar after the planarization process within process variations. The planarization process may be, for example, a chemical-mechanical polish (CMP), a grinding process, or the like. In some embodiments, the planarization may be omitted, for example, if the through vias 416 are already exposed. In some embodiments, the planarization also exposes die connectors on dies (not illustrated) attached to the dielectric layer 408 and/or the metallization pattern 410.

In FIGS. 8-12, a back-side redistribution structure 106 (not fully illustrated in FIG. 8 but fully illustrated below with respect to FIG. 12) may be formed on the encapsulant 420 and top surfaces of the through vias 416. In the embodiment shown, the back-side redistribution structure 106 includes a dielectric layer 108, a metallization pattern 110 (sometimes referred to as redistribution layers or redistribution lines) including conductive vias 110 extending through the dielectric layer 108, a dielectric layer 112, a metallization pattern 422, and a dielectric layer 424. More or fewer dielectric layers and metallization patterns, such as two to five dielectric layers and one to four metallization patterns, may be formed in the back-side redistribution structure 106. If fewer dielectric layers and metallization patterns are to be formed, steps and process discussed below may be omitted. If more dielectric layers and metallization patterns are to be formed, steps and processes discussed below may be repeated.

Figure 8:
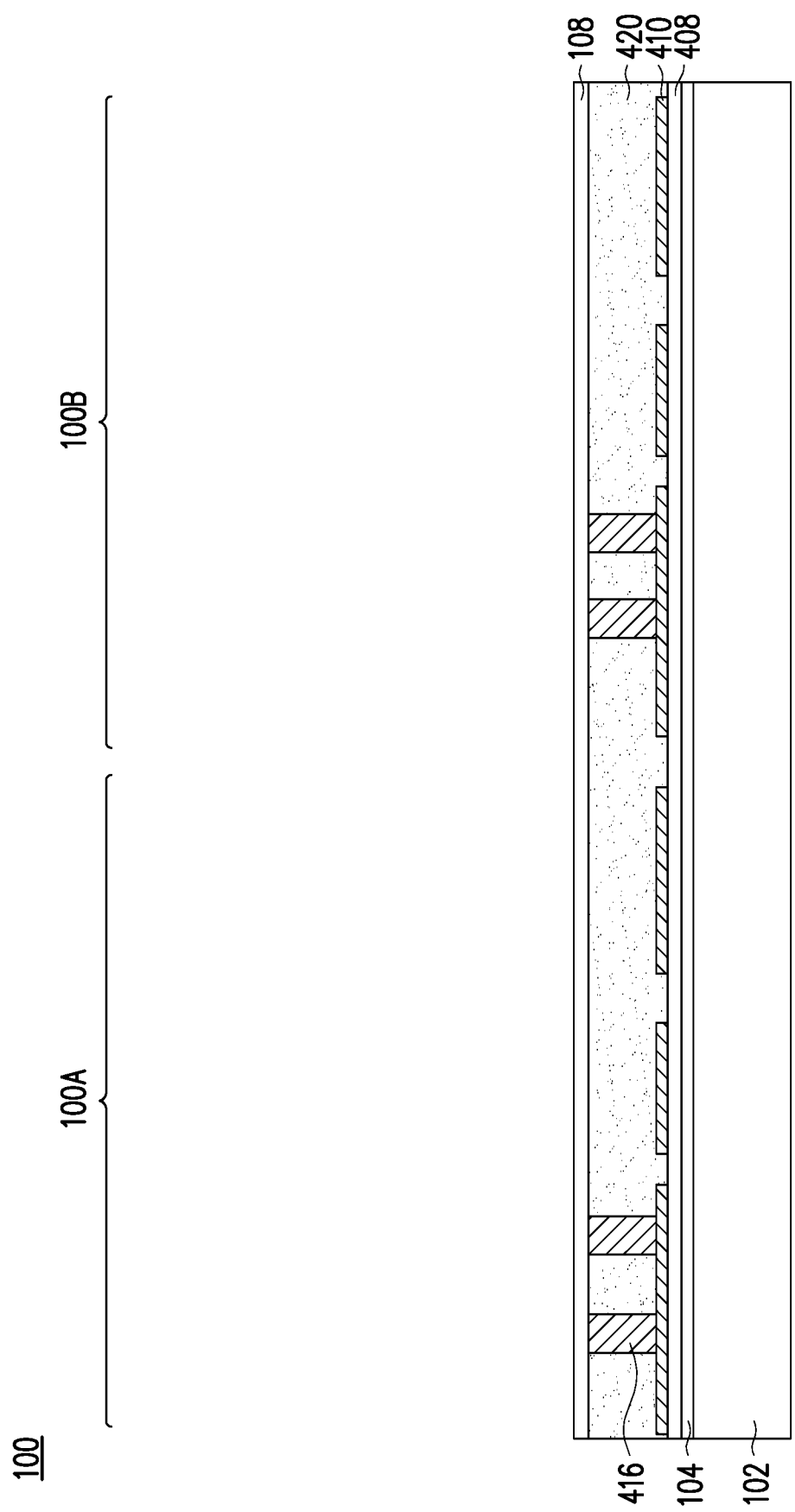
FIG. 8 illustrates a formation of a dielectric layer in accordance with some embodiments.

Referring now to FIG. 8, the dielectric layer 108 is formed on the encapsulant 420 and the through vias 416. In some embodiments, the dielectric layer 108 may be formed from a polymer material comprising a solvent, a polymer precursor 500, a cross-linker 510, and a photosensitizer. The mixture may further comprise one or more additives.

In some embodiments the polymer precursor 500 may be a polymer that is designed to work in conjunction with the remaining components in order to form the dielectric layer 108. The polymer precursor 500 may be chosen to produce polyimide backbones with fewer imide rings, which may lower the dissipation factor (Df) of the polymer material and reduce device insertion loss. As such, in some embodiments the polymer precursor 500 may be a polyamic acid ester comprising a plurality of monomers with the following formula:

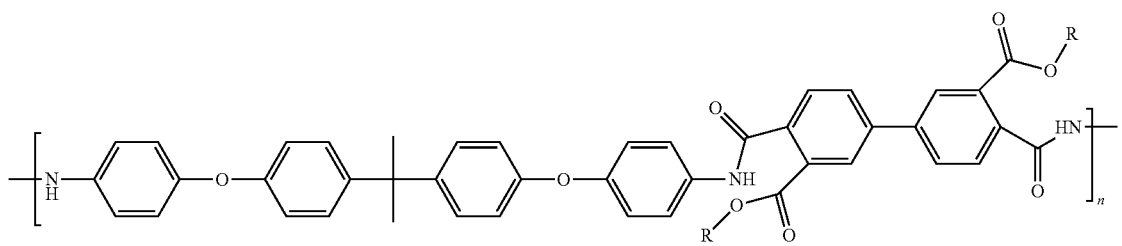

wherein n outside the brackets represents a number of the repeating unit, and wherein R has the following formula:

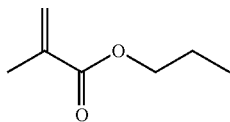

In some embodiments, the mixture comprises about 20% to about 40% by weight of the polyamic acid ester, such as about 25% to about 35%.

Figure 9A:
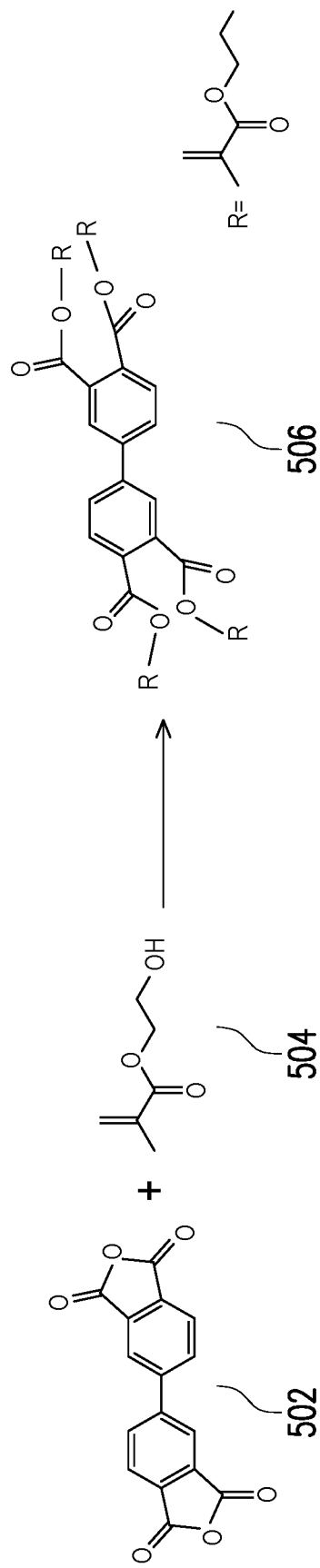
Figure 9B:
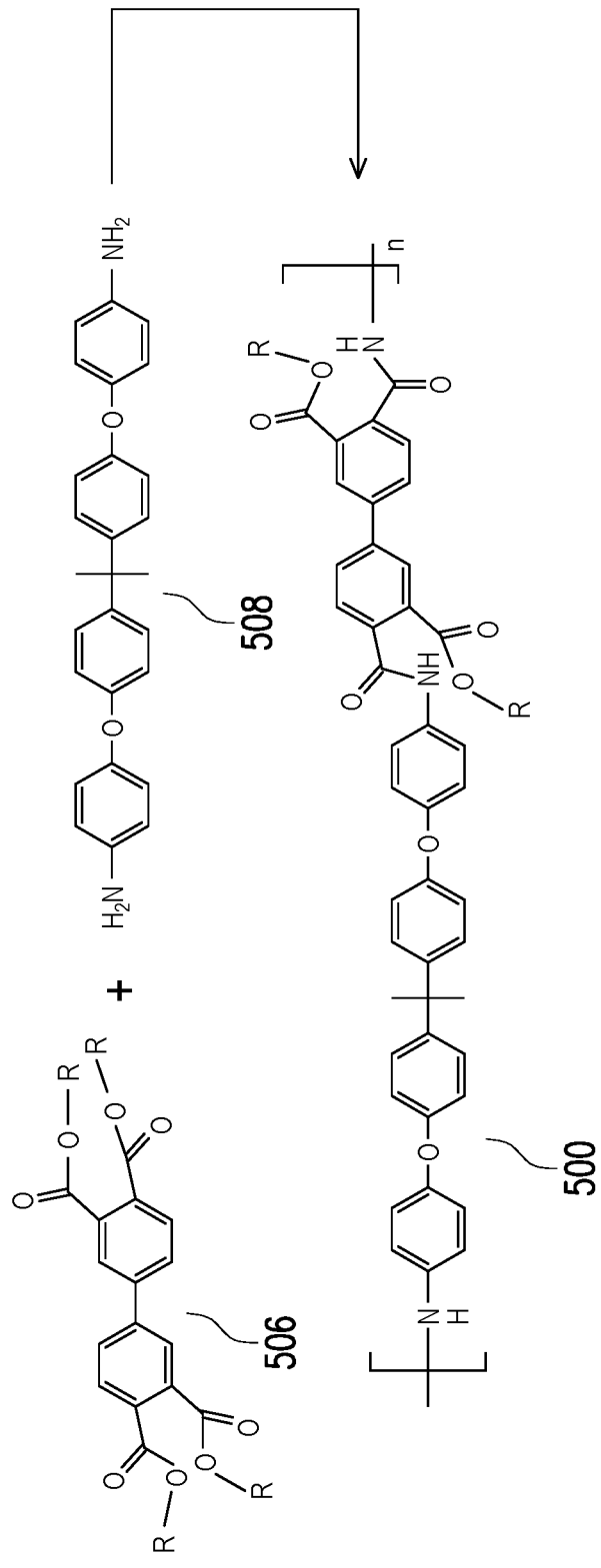

FIGS. 9A and 9B illustrate that, in embodiments in which the above described polyamic acid ester is utilized to form the dielectric layer 108, the polymer precursor 500 may be prepared using a series of reactions. For example, and looking at FIG. 9A first, a first reactant 502 and a second reactant 504 can be reacted together to obtain a first intermediate product 506. In an embodiment the first reactant 502 may comprise an aromatic anhydride such as 3,3,4,4-Biphenyltetracarboxylic dianhydride (BPDA), 4,4'-Oxydiphthalic anhydride, or 4,4'-(4,4'-Isopropylidenediphenoxy)bis(phthalic anhydride), while the second reactant 504 may comprise a chemical such as 2-Hydroxyethyl methacrylate. However, any suitable reactant may be utilized.

FIG. 9B illustrates that, once the first intermediate product 506 has been obtained, the first intermediate product 506 can be reacted with a third reactant 508 in order to obtain the desired polymer precursor 500. In an embodiment the third reactant 508 may be an aromatic amine such as 4,4-(4,4-isopropylidenediphenyl-1,1-diyldioxy)dianiline (BAPP), 4,4'-(1,1'-Biphenyl-4,4'-diyldioxy)dianiline, or 4,4'-(1,4-Phenylenediisopropylidene)bisaniline. However, any suitable reactant may be utilized.

FIGS. 9C-9D illustrates alternate intermediate precursors that may be formed. For example, FIG. 9C illustrates a first intermediate polymer precursor 500' that may be produced prior to forming the polymer precursor 500, while FIG. 9D illustrates a second intermediate polymer precursor 500" that may also be produced prior to forming the polymer precursor 500. Any suitable intermediate polymer precursors may be formed, and all such precursors are fully intended to be included within the scope of the embodiments.

In some embodiments the solvent comprises an organic solvent which may be used in order to mix, transport, and disperse the remaining components of the polymer material. As such, in some embodiments the organic solvent may comprise 1-Methyl-2-pyrrolidone (NMP), gamma-butyrolactone (GBL), tetrahydrofuran (THF), or Dimethyl sulfoxide (DMSO). However, any suitable organic solvent may be utilized. In some embodiments, the polymer material comprises about 30% to about 60% by weight solvent.

In additional embodiments the solvent may additionally comprise not only the organic solvent as described above, but may also comprise a second solvent in order to achieve better solubility. In such embodiments, the solvent may comprise not only 1-Methyl-2-pyrrolidone (NMP), but may also comprise a second organic solvent such as ethyl lactate (EL), dimethylformamide (DMF), or dimethyl sulfoxide (DMSO). However, any suitable organic solvent may be utilized for the second organic solvent.

In some embodiments, the polymer material comprises about 45% to about 55% by weight NMP. Using about 45% to about 55% by weight NMP may be useful for achieving a suitable viscosity in order to produce the desired film thickness. Using less than about 45% by weight NMP may be disadvantageous because it may lead to high viscosity and poor solubility. Using more than about 55% by weight NMP may be disadvantageous because it may lead to low viscosity and an undesirably thin film.

In some embodiments, the polymer material comprises about 10% to about 15% by weight EL. Using about 10% to about 15% by weight EL may be useful for achieving desired solubility. Using less than about 10% by weight EL may be disadvantageous because it may lead to undesired precipitation. Using more than about 15% by weight EL may be disadvantageous because it may lead to formation of undesirable voids in the solution.

The cross-linker 510 (not illustrated in FIGS. 9A-9D but illustrated below with respect to FIG. 10B) may form bonds that link one polymer chain to another during exposure of the polymer material (see FIG. 10B below). The resulting composition may have a greater rigidity than it otherwise would have without cross-linking. In some embodiments, the cross-linker 510 comprises any suitable cross-linking agent, such as tetraethylene glycol dimethacrylate (acrylate). The polymer material may comprise about 1% to about 5% by weight cross-linker 510. In other embodiments, a cross-linking agent is not used in the mixture to form the polymer material, and the polymer material does not comprise a cross-linker 510.

The photosensitizers, or photoactive components (PACs), may be photoactive components such as photoacid generators, photobase generators, free-radical generators, or the like, and the photosensitizers may be positive-acting or negative-acting. In an embodiment in which the photosensitizers are a photoacid generator, the photosensitizers may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the photosensitizers are a free-radical generator, the photosensitizers may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the photosensitizers are a photobase generator, the photosensitizers may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. In an embodiment, a positive tone photosensitizer, such as dibenzoylmethane, or a negative tone photosensitizer, such as 2,2'-(phenylimino)diethanol, may be used as the photosensitizer. However, as one of ordinary skill in the art will recognize, the chemical compounds listed herein are merely intended as illustrated examples of the photosensitizers and are not intended to limit the embodiments to only those photosensitizers specifically described. Rather, any suitable photosensitizer may be utilized, and all such photosensitizers are fully intended to be included within the scope of the present embodiments. The polymer material may comprise about 1-8% by weight photosensitizer. In other embodiments, a photosensitizer is not used in the mixture to form the polymer material, and the polymer material does not comprise a photosensitizer.

In addition to the photosensitizer, the mixture may also comprise an additive. The additive helps to reduce the temperature used for curing. In particular, the additive may serve to increase the free volume of the mixture. The high polarity and/or high steric hindrance of the additive may serve to overcome the polarity—e.g., by lowering the dipole moment—of the polymers formed during and after exposure. Consequently, as discussed below, a lower exposure energy may be used. The reduced polarity across the reactive portions of the polymer allow branches of the molecules to come together to form rings and thereby improve the cyclization during curing at the lower temperature. The additive may serve as a catalyst to the reaction and, therefore, remain separate from the polymer before and after curing, although, the final polymer layer or dielectric layer, after curing, may comprise some or all of the original additive.

The additive may comprise any molecule suitable for increasing the free volume of the polymer material or polymer mixture. As discussed above, the additive may have a high polarity and/or high steric hindrance. In order to increase the free volume of the mixture, the additive may be selected and may have a structure similar to the selected cross-linker 510. For example, the additive may be a polyether, such as polyethylene glycol (PEG) (e.g., at molecular weight 600 and comprising 5% by weight of the polymer material), polypropylene glycol (PPG), combinations of these, or the like. Similarly, in an embodiment in which tetraethylene glycol dimethacrylate is used as the cross-linker 510, for example, the additive may be one of the compounds listed above, the following compound illustrated below, or a compound with a similar chemical structure. For example, the additive may comprise a long alkyl chain containing an ether group or an end group as follows:

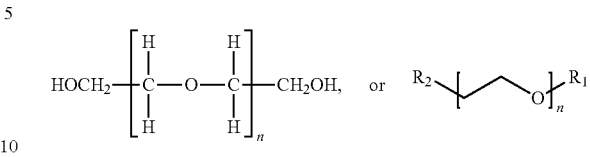

wherein $R_1$ may comprise —H, alkyl chain, methyl, or t-butyl, $R_2$ may comprise —H, -alkyl chain, methyl, t-butyl, —OH, —NH$_2$, —SH, —F, —Cl, —Br, —I, or —SO$_3$H, and wherein n outside the brackets represents a number of the repeating unit and is between about 4 to about 200, although any suitable number may be used.

Figure 10A:
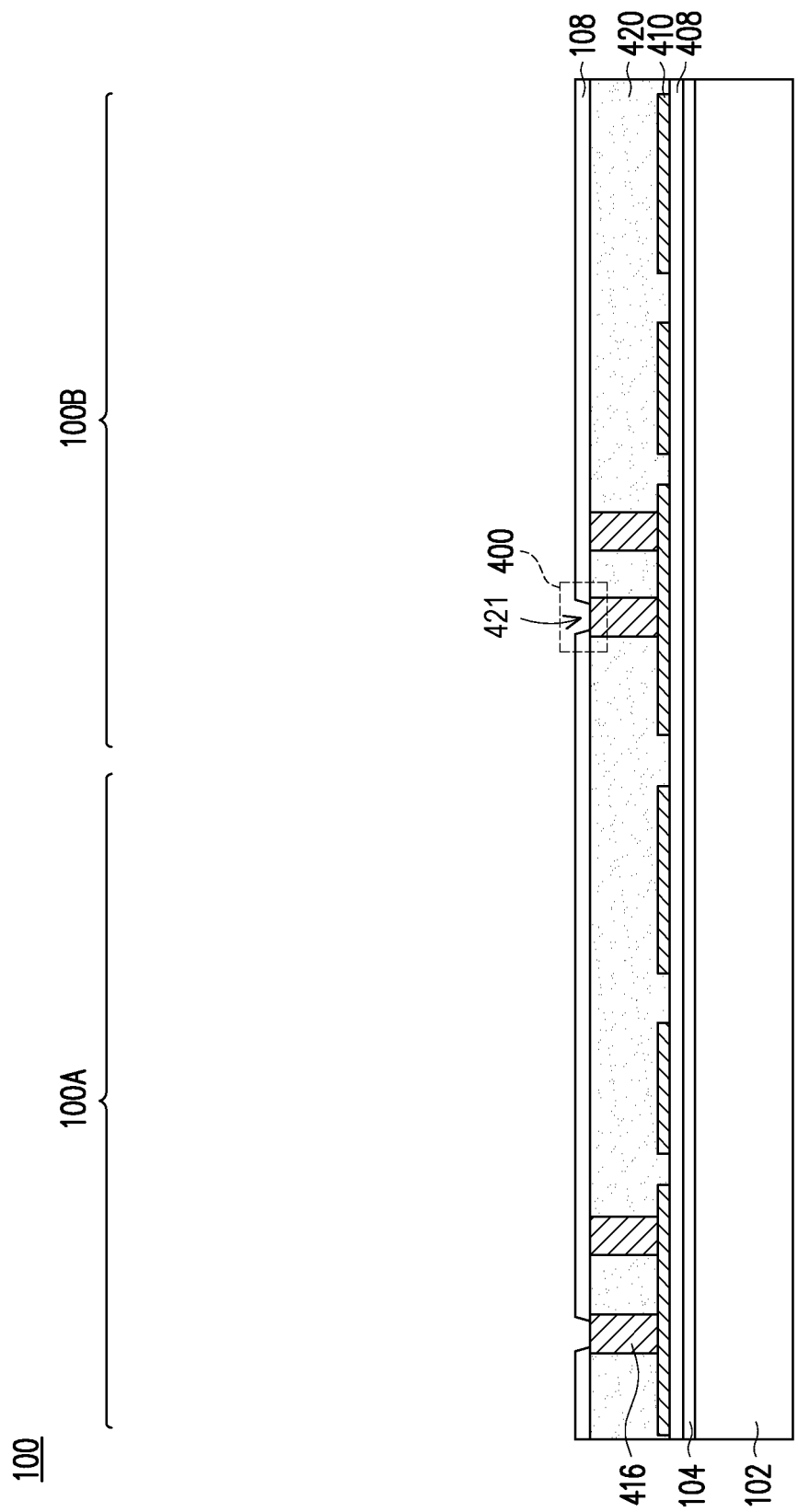
FIGS. 10A-10E illustrate a patterning of the dielectric layer in accordance with some embodiments.

In FIG. 10A, once the dielectric layer 108 has been placed, the dielectric layer 108 is patterned to form openings 421 exposing portions of the through vias 416 using, e.g., a photolithographic masking and etching process or, if the material of the dielectric layer 108 is photosensitive, exposing and developing the material of the dielectric layer 108.

In some embodiments, the energy source supplies energy such as light to the dielectric layer 108 in order to induce a reaction of the photosensitizers, which in turn reacts with the first redistribution passivation layer polymer resin to chemically alter those portions of the dielectric layer 108 to which the energy impinges. In an embodiment the energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy, such as mercury vapor lamps, xenon lamps, carbon arc lamps or the like, may also be utilized.

A patterned mask is located between the energy source and the dielectric layer 108 in order to block portions of the energy to form a patterned energy prior to the energy actually impinging upon the dielectric layer 108. In an embodiment the patterned mask may comprise a series of layers (e.g., substrate, absorbance layers, anti-reflective coating layers, shielding layers, etc.) to reflect, absorb, or otherwise block portions of the energy from reaching those portions of the dielectric layer 108 which are not desired to be illuminated. The desired pattern may be formed in the patterned mask by forming openings through the patterned mask in the desired shape of illumination.

In some embodiments, the dielectric layer 108 is placed on a support plate. Once the pattern has been aligned to the dielectric layer 108, the energy source generates the desired energy (e.g., light) which passes through the patterned mask on its way to the dielectric layer 108. The patterned energy impinging upon portions of the dielectric layer 108 induces a reaction of the photosensitizers within the dielectric layer 108. In some embodiments, an exposure energy of less than about 250 mJ may be used to induce the reaction of the photosensitizers within the dielectric layer 108. This reduced exposure energy may be useful for achieving higher resolution of critical dimensions such as widths of subsequently formed conductive features in redistribution layers. For example, to form the openings 24 with widths of about 7 μm, an exposure energy in a range of about 175 mJ to about 225 mJ may be used. The chemical reaction products of the photosensitizers' absorption of the patterned energy (e.g., acids/bases/free radicals) then reacts with the second redistribution passivation layer polymer resin, chemically altering the dielectric layer 108 in those portions that were illuminated through the patterned mask.

Figure 10B:
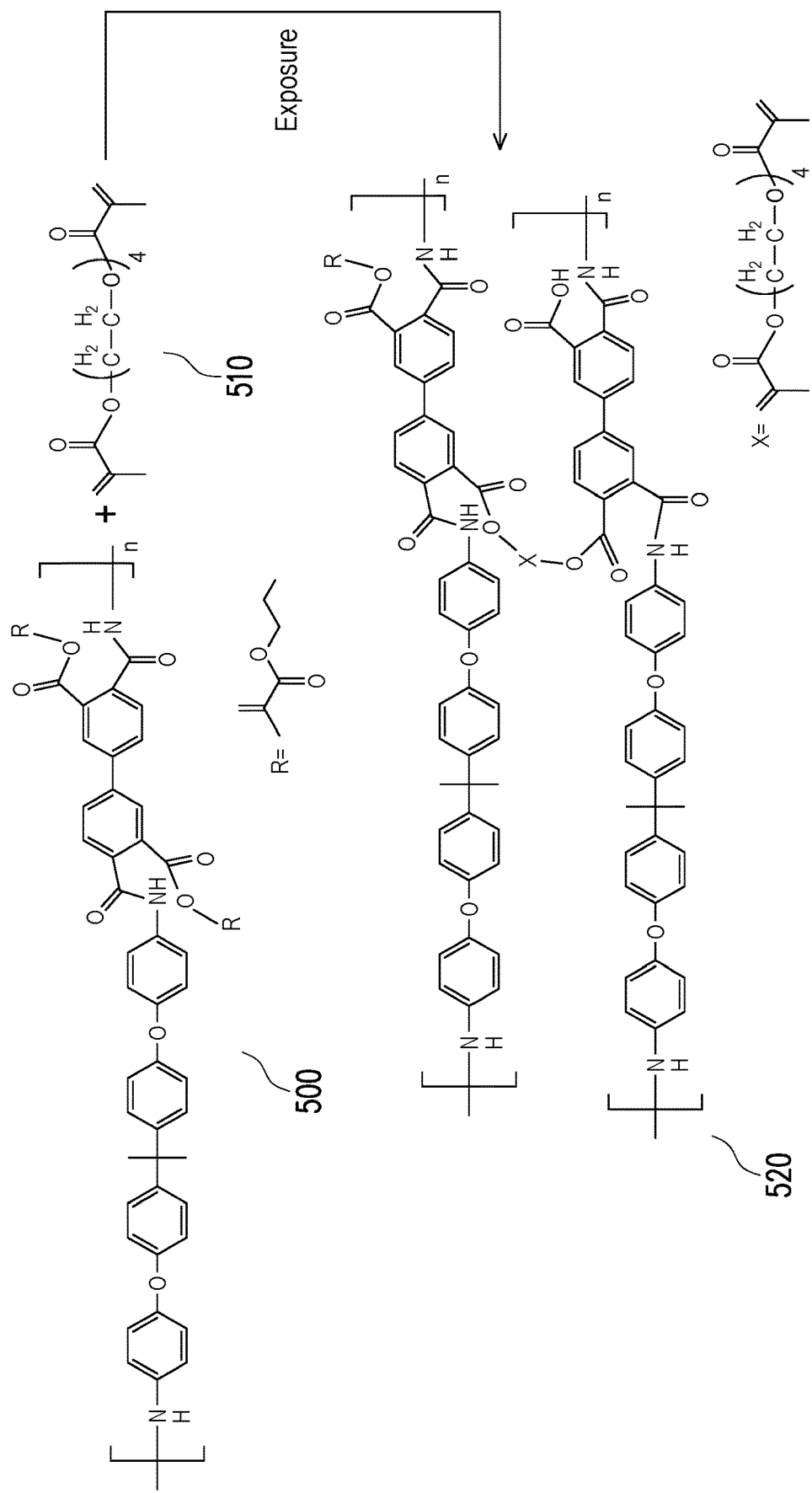

FIG. 10B illustrates a reaction between the polymer precursor 500, such as the polyamic acid ester, and a cross-linker 510 that may occur after the exposure has initiated the reaction with the photosensitizers, in accordance with some embodiments. The cross-linker 510 forms bonds that link one polymer chain to another, such as chains of the polyamic acid ester 500 as illustrated in FIG. 10B, producing a cross-linked polymer chain 520. The resulting cross-linked polymer chain 520 may have a greater rigidity than it otherwise would have without cross-linking.

After the dielectric layer 108 has been exposed, a first post-exposure bake (PEB) may be used in order to assist in the generating, dispersing, and reacting of the acid/base/free radical generated from the impingement of the energy upon the photosensitizers during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In some embodiments, the temperature of the dielectric layer 108 may be increased to be in a range of about 70° C. and about 120° C. for a period in a range of about 180 mJ and about 350 mJ.

Once the dielectric layer 108 has been exposed and baked, the dielectric layer 108 may be developed with the use of a developer. In an embodiment in which the dielectric layer 108 is the low temperature cured polyimide, the first developer may be a negative tone developer such as an organic solvent or critical fluid that may be utilized to remove those portions of the dielectric layer 108 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include cyclopentanon (A515), hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

The first developer may be applied to the dielectric layer 108 using, e.g., a spin-on process. In this process the first developer is applied to the dielectric layer 108 from above the dielectric layer 108 while the dielectric layer 108 is rotated. In an embodiment the first developer may be at a temperature in a range of about _20° C. and about 30° C., and the development may continue for in a range of about 50 seconds to about 70 seconds, which may be advantageous for increasing production throughput.

However, while the spin-on method described herein is one suitable method for developing the dielectric layer 108 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

Once the dielectric layer 108 has been developed, the dielectric layer 108 may be rinsed. In an embodiment the dielectric layer 108 may be rinsed with a rinsing liquid such as propylene glycol monomethyl ether acetate, although any suitable rinse solution, such as water, may be used.

After development a post development baking process may be utilized in order to help polymerize and stabilize the dielectric layer 108 after the development process. In an embodiment the post-developing baking process may be performed at a temperature of between about 80° C. and about 200° C., or between about 80° C. and about 170° C., for a time of between about 60 sec and about 300 sec, such as about 2 minutes.

After the post-development baking, the dielectric layer 108 may be cured. In some embodiments in which the dielectric layer 108 comprises a low temperature cured polyimide, the curing process may be performed at a temperature in a range of about 200° C. to about 300° C. In other embodiments, the curing process may be performed at a temperature greater than about 300° C. The dielectric layer 108 may be cured for a time in a range of about 10 minutes and about 180 minutes. However, any suitable temperature and time may be utilized.

Figure 10C:
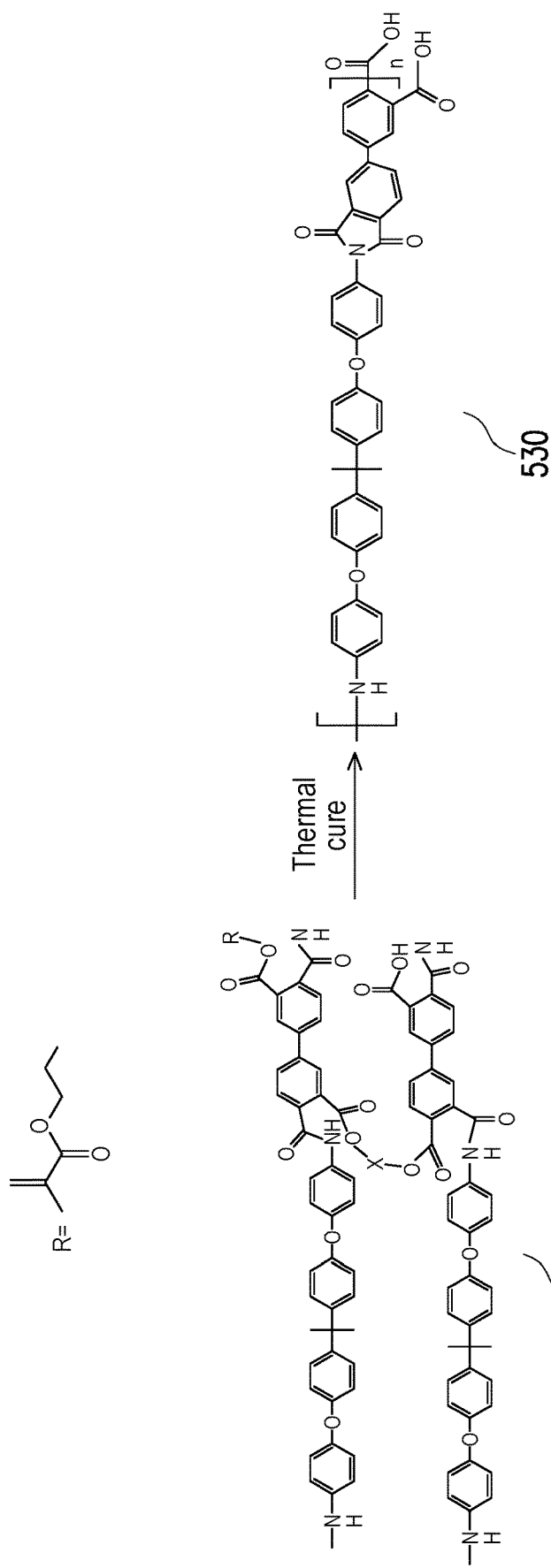

FIG. 10C illustrates that the thermal cure may convert the cross-linked polymer chains 520, as illustrated above in respect to FIG. 10B, into polyimide chains 530. In one embodiment the polyimide chains 530 may be finalized to have monomers with the following formula:

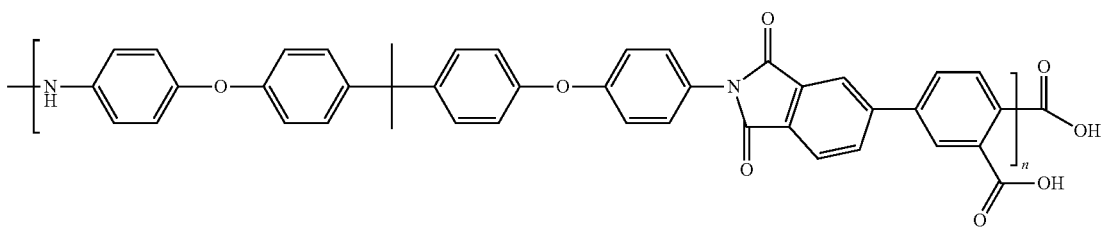

wherein n outside the brackets represents a number of the repeating unit. In some embodiments, the above polyimide chains 530 have a molecular weight in a range of about 30000 to about 60000, which may be advantageous for improving film properties such as strength and resistance to delamination. Polyimide chains with molecular weight less than about 30000 may be disadvantageous due to having less strength and greater susceptibility to delamination. Polyimide chains with molecular weight greater than about 80000 may be disadvantageous due to poor solubility. The polyimide chains 530 may have polyimide backbones with fewer imide rings, which may lower the dissipation factor (Df) of the polymer material and reduce device insertion loss.

In some embodiments, the dielectric layer 108, instead of having the precise chemical structure as presented above with respect to the polyimide chains 530, may comprise additional monomers either with the monomers of the polyimide chains 530 or else in place of the precise monomers presented. For example, in some embodiments the dielectric layer 108 may comprise one or more monomers described by the following chemical formulas:

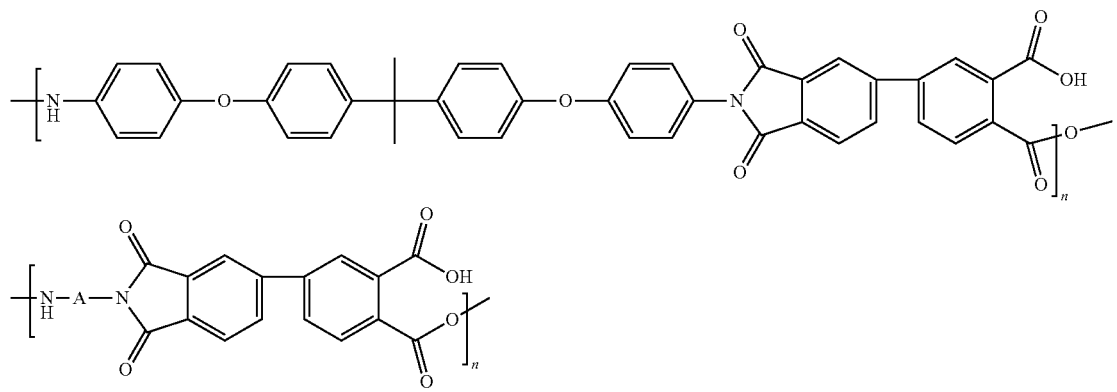

wherein n outside the brackets represents a number of the repeating unit.

In other embodiments, the dielectric layer 108 may comprise one or more monomers described by the formula $NH_2$-A-$NH_2$, where A represents the core of the monomer. Monomers described by the formula $NH_2$-A-$NH_2$ may include the following chemical structures:

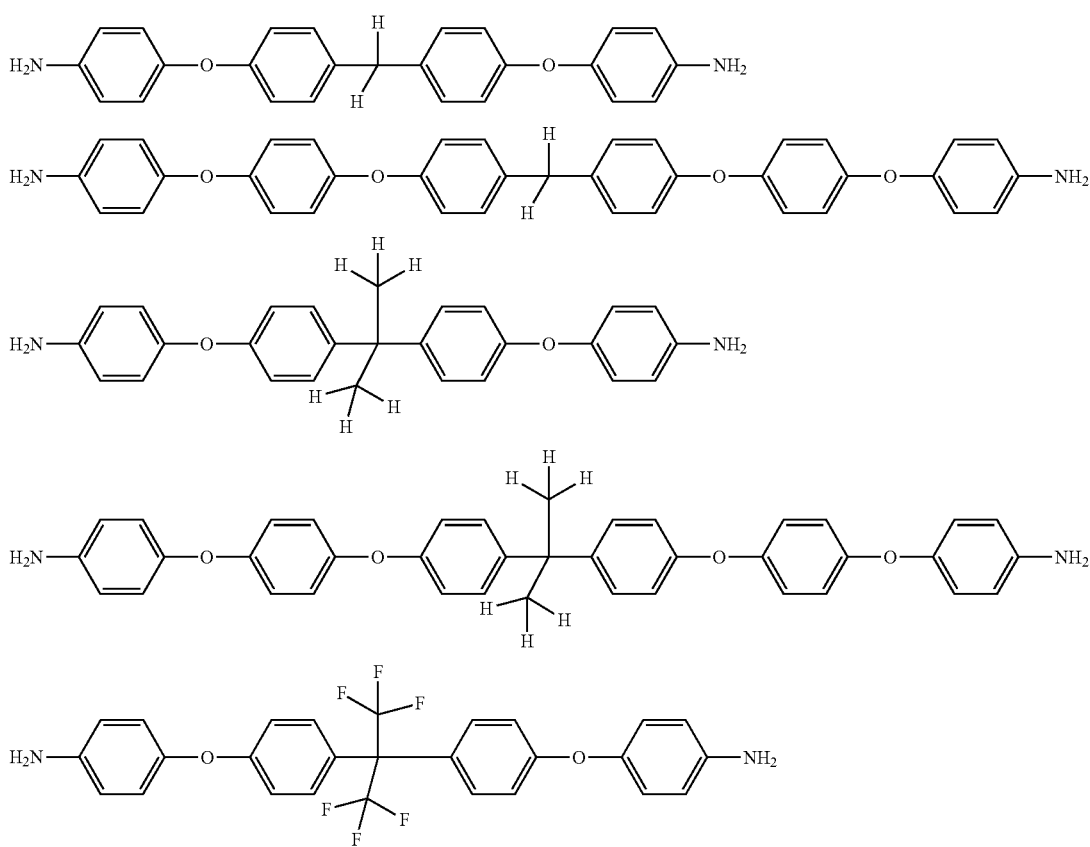

-continued
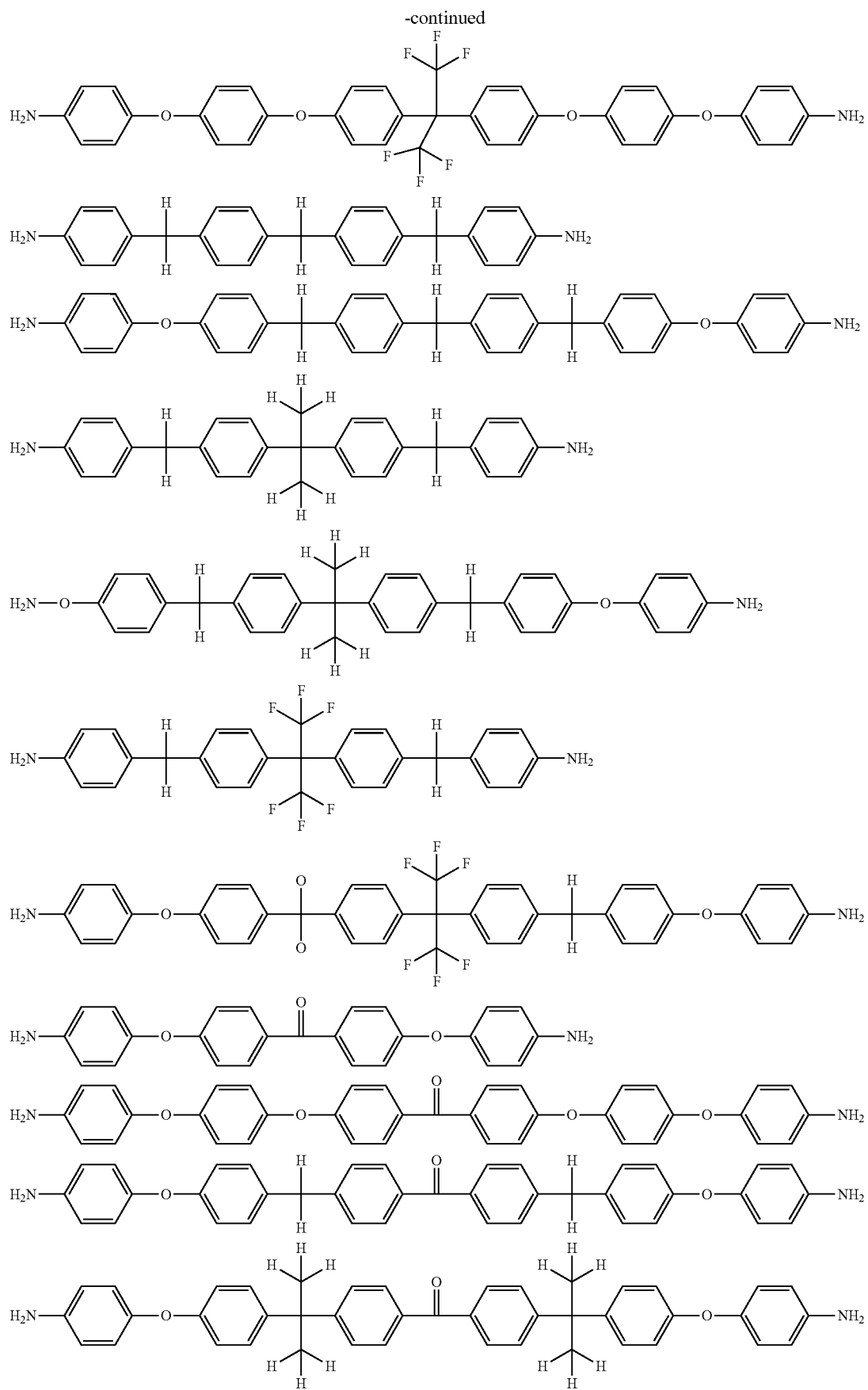

-continued

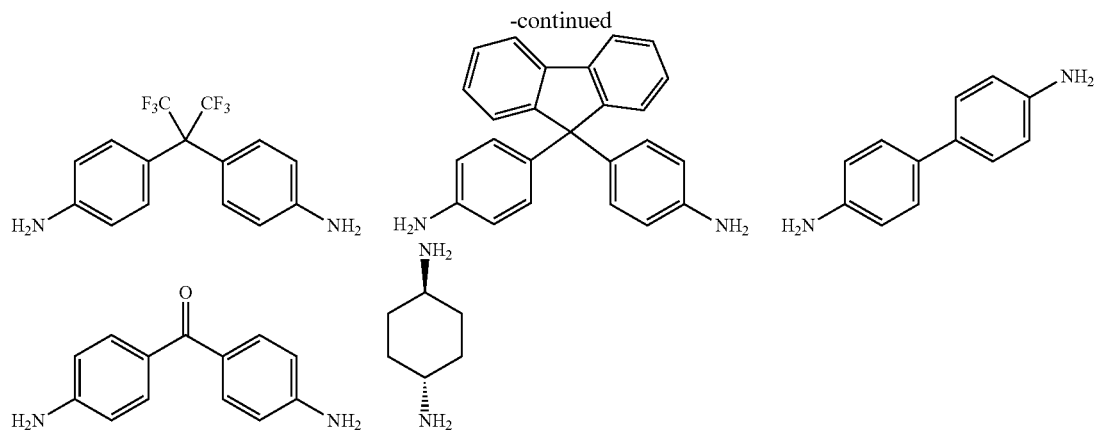

In some embodiments in which the polymer material of the dielectric layer 108 is cured at about 230° C., the polymer material of the dielectric layer 124, such as e.g. polyimide chains 530, has advantageous properties after the curing process. The polymer material may have a dielectric constant (Dk) of about 2.9 at about 60 GHz and a dissipation factor (Df) in a range of about 0.007 to about 0.01 at about 60 GHz. The Df of the polymer material may be lowered to about 0.007 by use of polyimide backbones with fewer imide rings such as, e.g., the polyimide chains 530 as illustrated above in respect to FIG. 10D. Having a Df in a range of about 0.003 to about 0.015 may be useful for reducing device insertion loss. In some embodiments, polyimide cyclization of about 100% may be achieved.

The polymer material may have a thermomechanical analysis glass transition (TMA-Tg) temperature in a range of about 206° C. to about 216° C. The polymer material may have a coefficient of linear thermal expansion (CTE1) in a range of about 46 ppm/° C. to about 53 ppm/° C., or about 48 ppm/° C. to about 49 ppm/° C. Lower CTE1, such as in a range of about 46 ppm/° C. to about 53 ppm/° C., may be useful for reducing broken lines in subsequently formed redistribution layers (RDLs), such as e.g. the metallization pattern 110 described below with respect to FIG. 11. The polymer material may have a tensile strength in a range of about 157 MPa to about 181 MPa, or about 168 MPa to about 177 MPa. The polymer material may have adhesion in a range of about 500 N/m to about 800 N/m.

The polymer material may have a Young's modulus in a range of about 3.7 GPa to about 3.8 GPa. The Young's modulus of about 3.8 GPa may be achieved in the polymer material by use of the polyimide backbones of, e.g., the polyimide chains 530 as illustrated above in respect to FIG. 10D. A more rigid polymer material with a Young's modulus of about 3.8 GPa may be useful for reducing substrate stress due to increased molecular flatness of the polymer material. For example, the substrate stress for solder joints on die corners may be reduced from about 1.0, which may cause adverse delamination, to about 0.9. Delamination on conductive features of subsequently formed metallization layers, such as e.g. the metallization pattern 110 described below with respect to FIG. 11, may be reduced by the polymer material's strength and rigidity as exhibited by its Young's modulus of about 3.8 GPa.

The polymer material may have an elongation percentage in a range of about 74% to about 86%, or about 80% to about 85%. The dielectric layer 108 may contract to a thickness in a range of about 5 μm to about 20 μm.

Figure 10D:
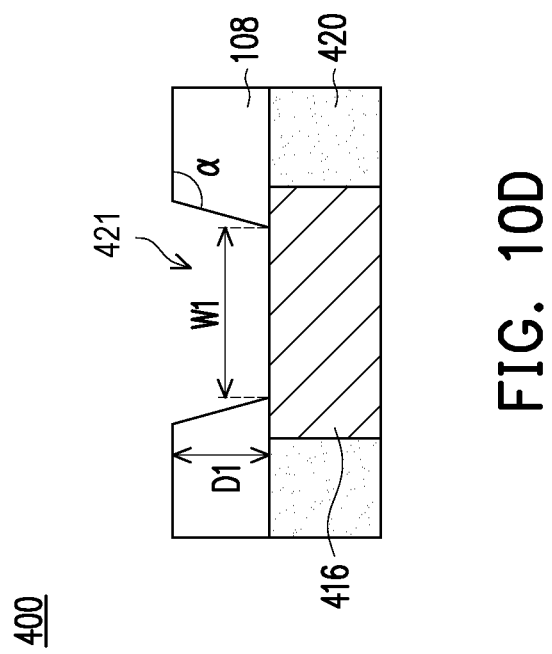

FIG. 10D illustrates a detailed view of region 400 as illustrated in FIG. 10A, showing an opening 421 after the patterning of the dielectric layer 108. In some embodiments, the opening 421 may be patterned with an exposure energy of about 250 mJ, a depth of about 10 μm a width W1 of less than 10 μm, such as in a range of about 3.9 μm and about 9.2 μm. The depth of focus (DOF) may be greater than about 20 μm. The lower exposure energy may allow for normal profiles of the opening 421 to be formed such that an angle α measured between sidewalls of the opening 421 with the top surface of the dielectric layer 108 is in a range of less than about 90°, such as about 80° to about 90°, which may be advantageous for good seed layer coverage. The angle α being greater than about 90° may be disadvantageous because it may lead to poor seed layer coverage.

Figure 10E:
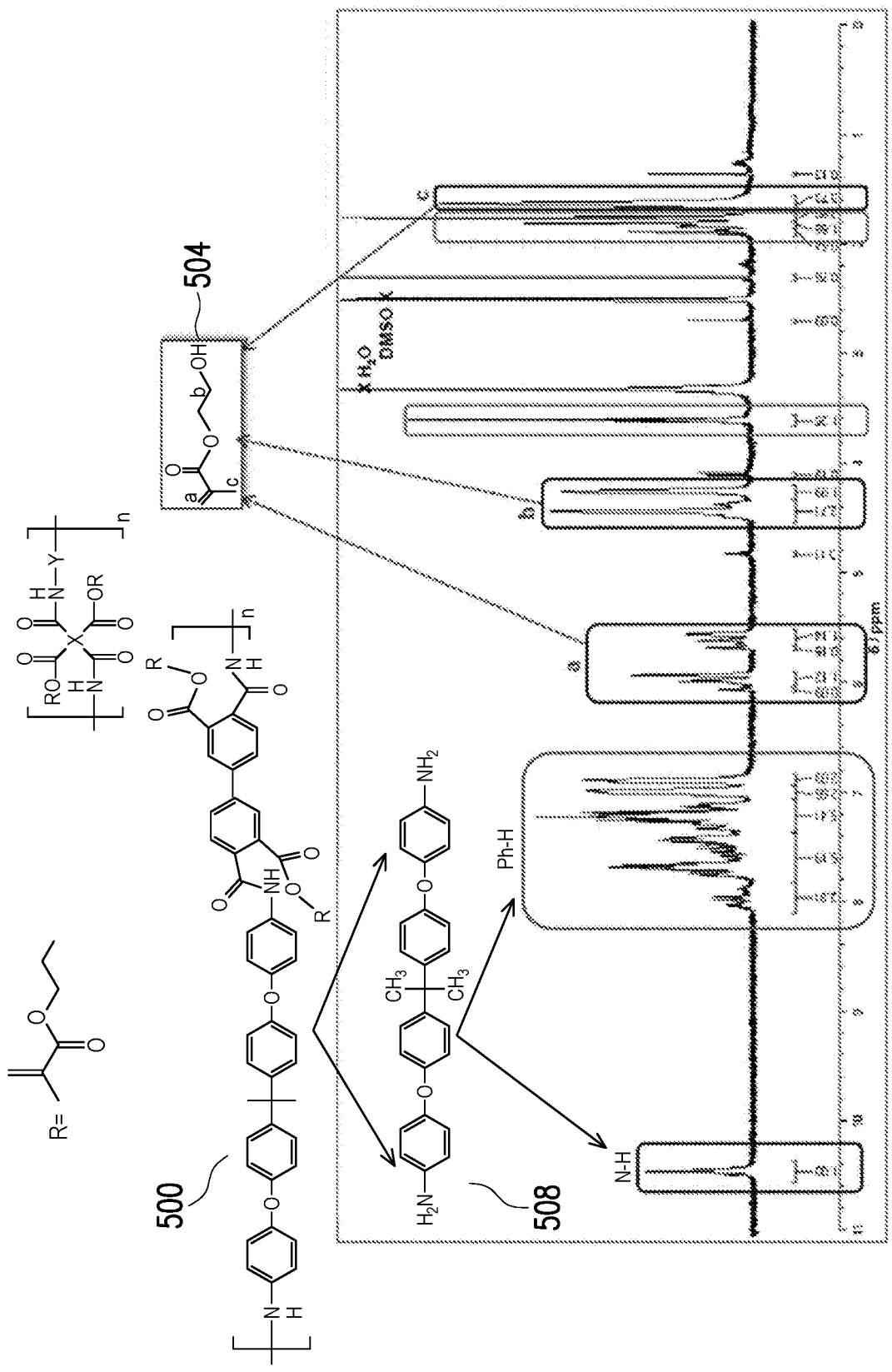

FIG. 10E provides mass analysis results illustrating one result of the inclusion of embodiments of the polyamic acid ester 500 in the polymer material, e.g. polyimide. In some embodiments, after the polymer material comprising the polyamic acid ester 500 is cured, FIG. 10E illustrates the use of the third monomer 508, e.g. BAPP, and the second reactant 504 in order to form the polymer material as peaks in a proton nuclear magnetic resonance spectrum.

Figure 11:
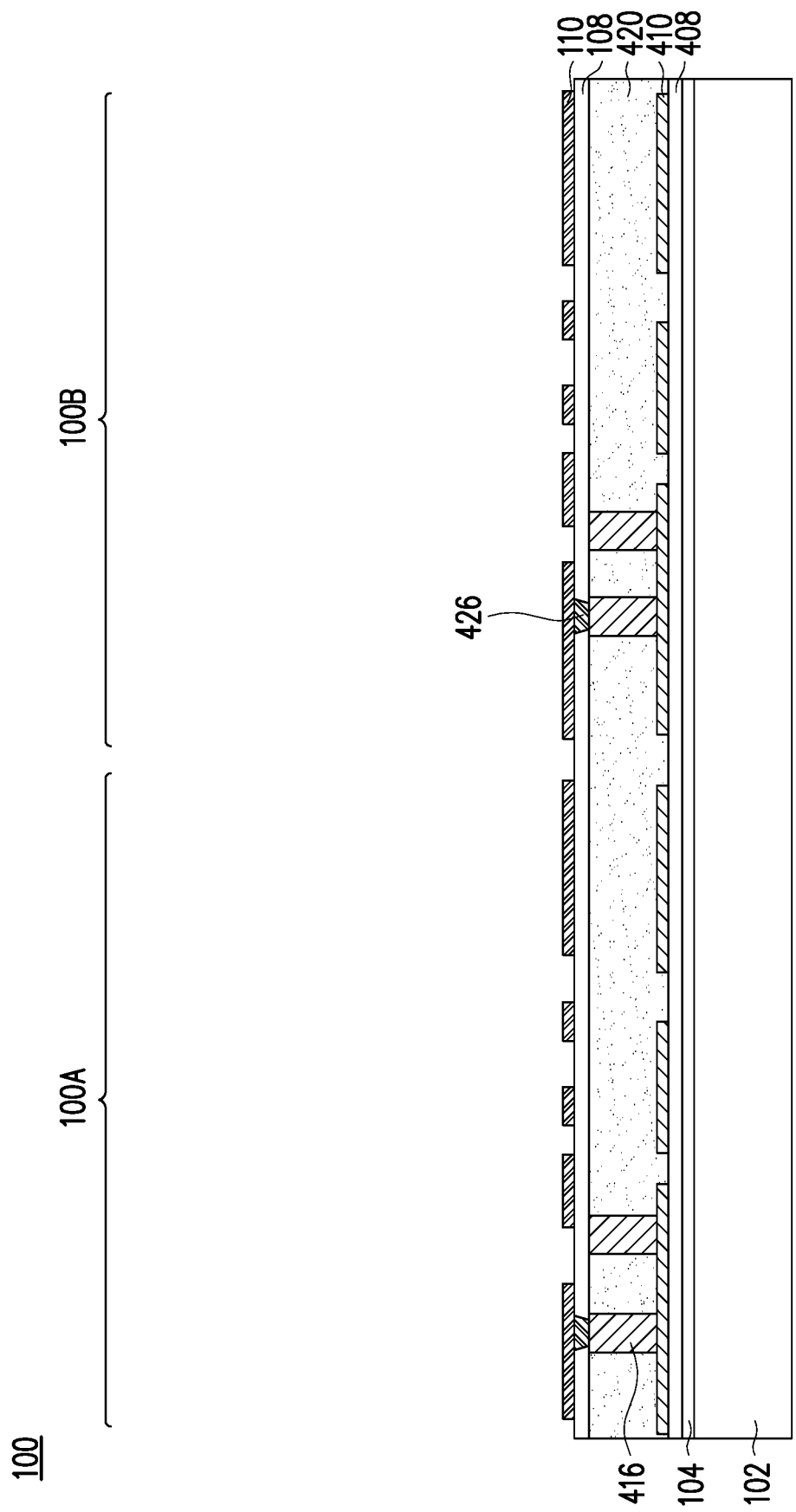
FIGS. 11 through 24 illustrate cross-sectional views of intermediate steps during a process for forming a package component in accordance with some embodiments.

In FIG. 11, the metallization pattern 110 is then formed. The metallization pattern 110 includes conductive elements extending along the major surface of the dielectric layer 108 and extending through the dielectric layer 108 to physically and electrically couple to the through vias 416. As an example to form the metallization pattern 110, a seed layer is formed over the dielectric layer 108 and in the openings extending through the dielectric layer 108. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 146. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like.

The combination of the conductive material and underlying portions of the seed layer form the metallization pattern 110, which includes conductive vias 426 formed in the openings 421. The metallization pattern 110 may have a resolution of about 10 μm, such as conductive features of the metallization pattern 110 having widths and thicknesses of about 10 μm or less. For example, the conductive vias 426 may have widths of about 7 μm, enabled by using lower exposure energy in a range of about 175 mJ to about 225 mJ. The conductive vias 426 may physically and electrically couple to the through vias 416. In some embodiments, some conductive vias 426 are formed above and physically and electrically couple to die connectors of dies (not illustrated) attached to the dielectric layer 408 and/or the metallization pattern 410, as described above with respect to FIG. 4. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The metallization pattern 110 may also comprise conductive features such as conductive lines. The polymer material of the dielectric layer 108 may provide lower CTE1 and higher adhesion, which may be useful for reducing broken conductive lines. This may reduce yield loss from about 100% to about 0%.

Figure 12:
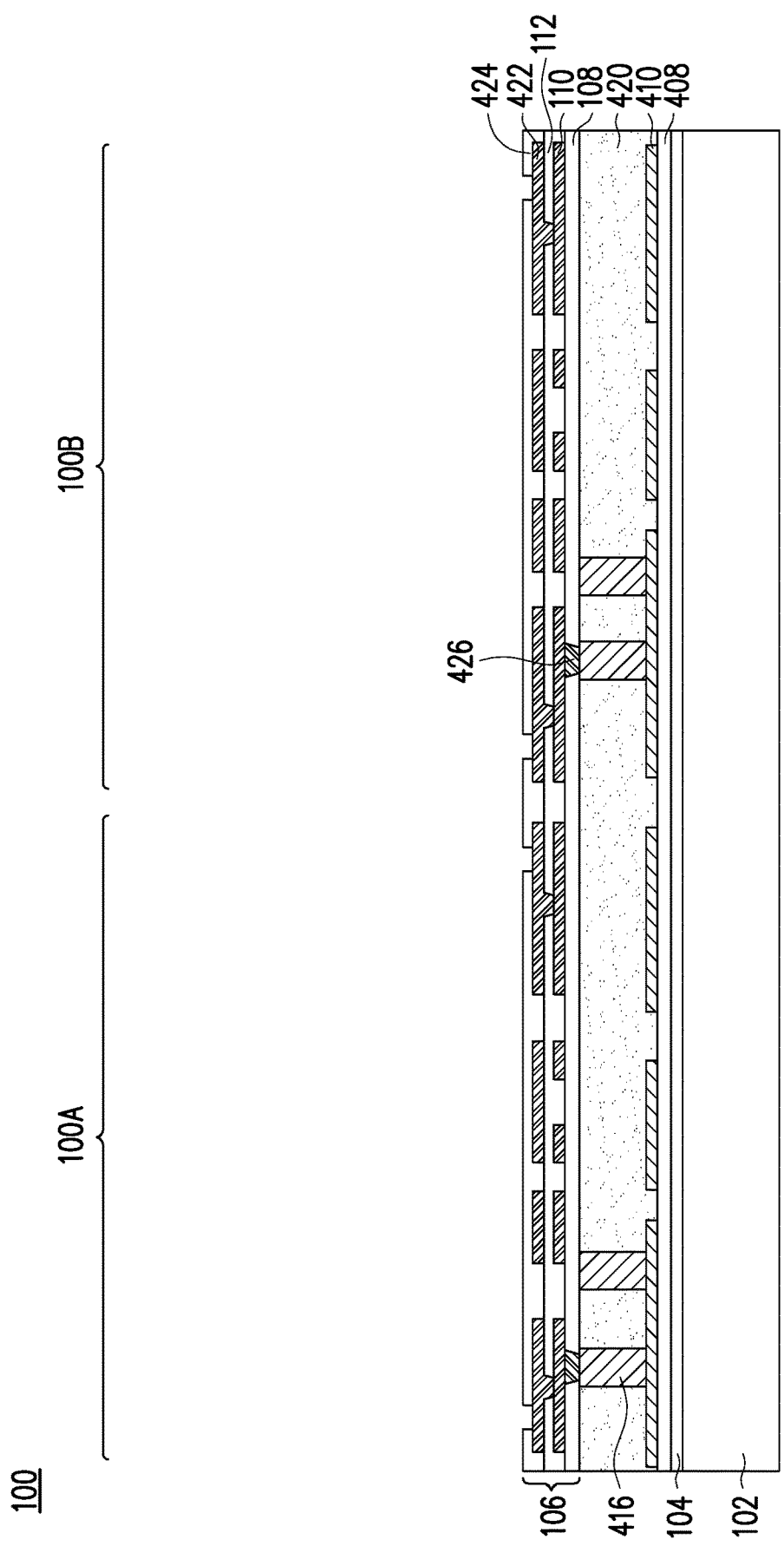

In FIG. 12, the dielectric layer 112 may be formed on the metallization pattern 110 and the dielectric layer 108. The dielectric layer 112 may be formed and patterned in a similar manner as the dielectric layer 108, as described above with respect to FIGS. 8-10. The patterning forms openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

FIG. 12 illustrates a redistribution structure 106 having two single metallization patterns 110 and 422 for illustrative purposes. In some embodiments, the back-side redistribution structure 106 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Figure 13:
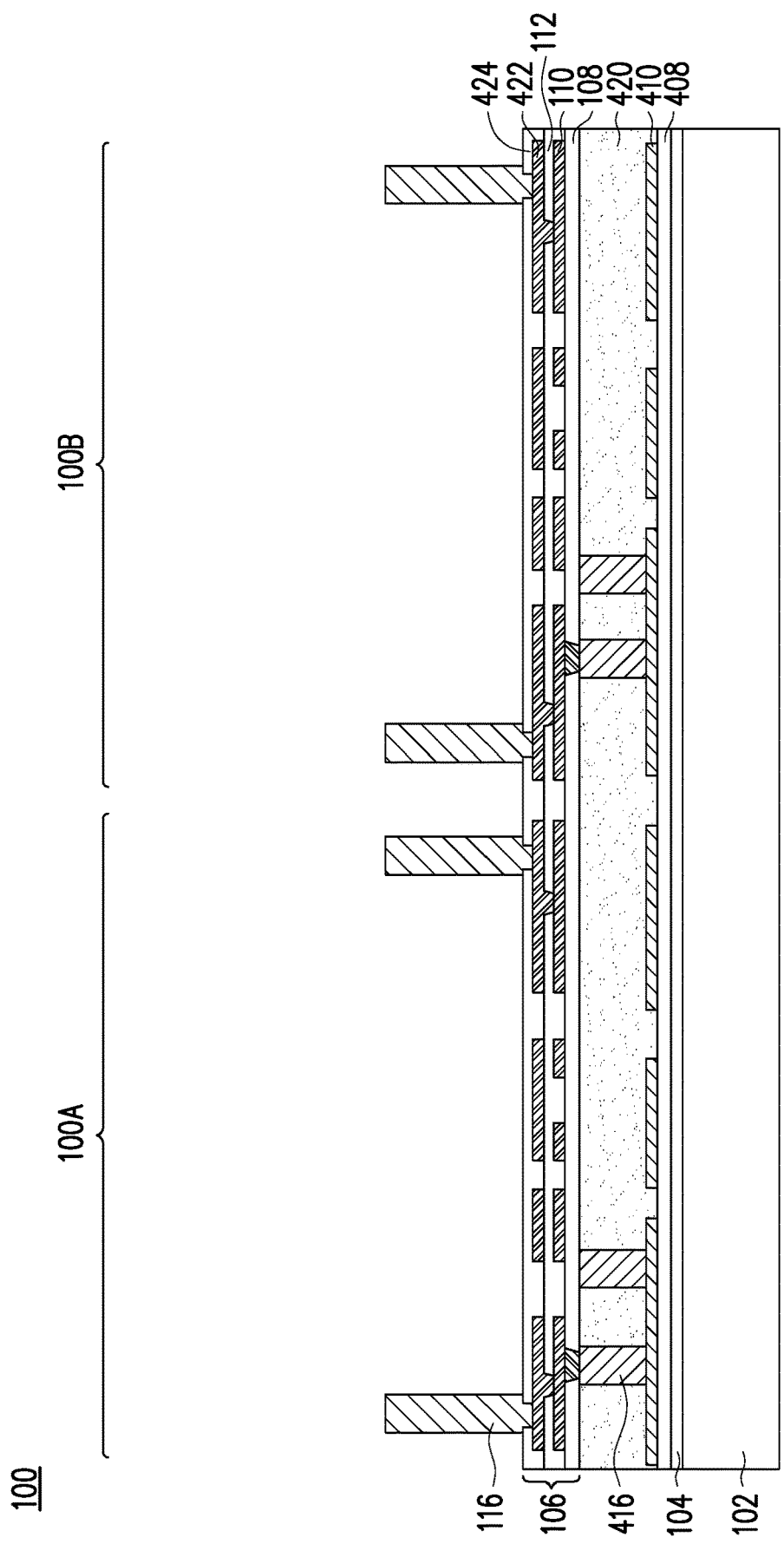

In FIG. 13, through vias 116 are formed in the openings 114 and extending away from the topmost dielectric layer of the back-side redistribution structure 106 (e.g., the dielectric layer 424). As an example to form the through vias 116, a seed layer (not shown) is formed over the back-side redistribution structure 106, e.g., on the dielectric layer 424 and portions of the metallization pattern 422 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 14:
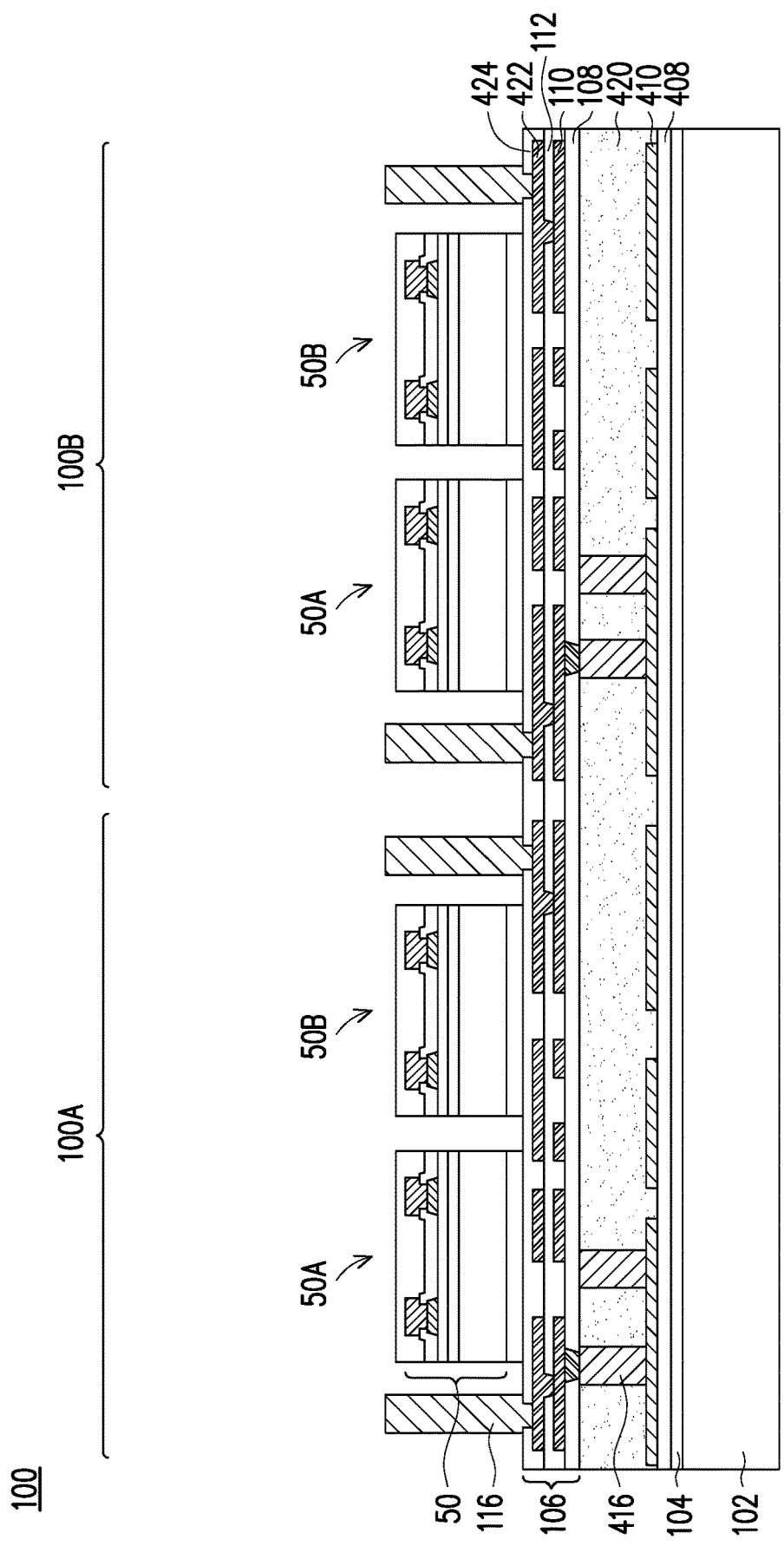

In FIG. 14, integrated circuit dies 50 (e.g., a first integrated circuit die 50A and a second integrated circuit die 50B) are adhered to the dielectric layer 422 by an adhesive 118. A desired type and quantity of integrated circuit dies 50 are adhered in each of the package regions 100A and 100B. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region 100A and the second package region 100B may be limited, particularly when the integrated circuit dies 50 include devices with a large footprint, such as SoCs. Use of the back-side redistribution structure 106 allows for an improved interconnect arrangement when the first package region 100A and the second package region 100B have limited space available for the through vias 116.

The adhesive 118 is on back-sides of the integrated circuit dies 50 and adheres the integrated circuit dies 50 to the back-side redistribution structure 106, such as to the dielectric layer 424. The adhesive 118 may be any suitable adhesive, epoxy, die attach film (DAF), or the like. The adhesive 118 may be applied to back-sides of the integrated circuit dies 50, may be applied over the surface of the carrier substrate 102 if no back-side redistribution structure 106 is utilized, or may be applied to an upper surface of the back-side redistribution structure 106 if applicable. For example, the adhesive 118 may be applied to the back-sides of the integrated circuit dies 50 before singulating to separate the integrated circuit dies 50.

Figure 15:
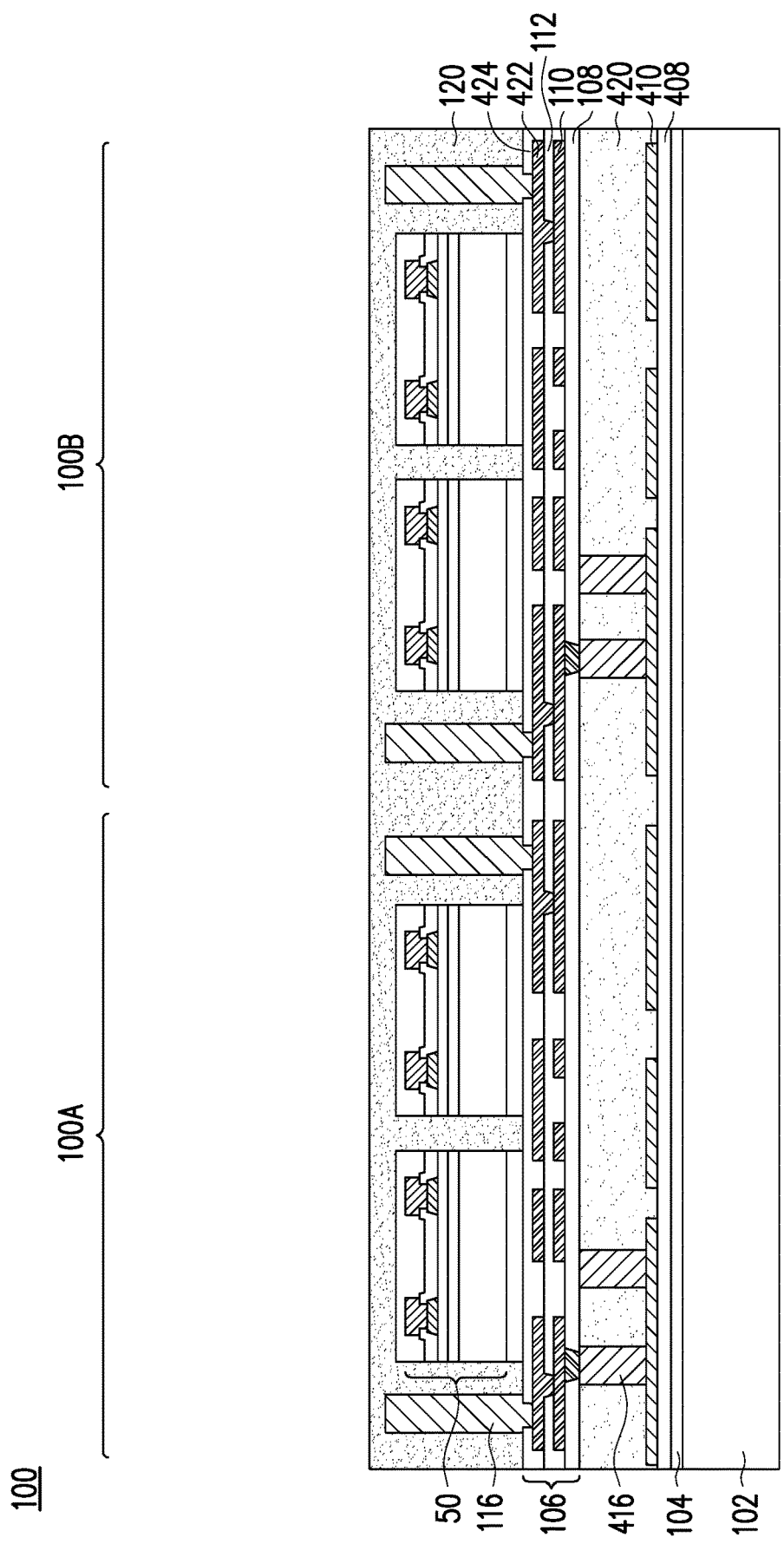

In FIG. 15, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

Figure 16:
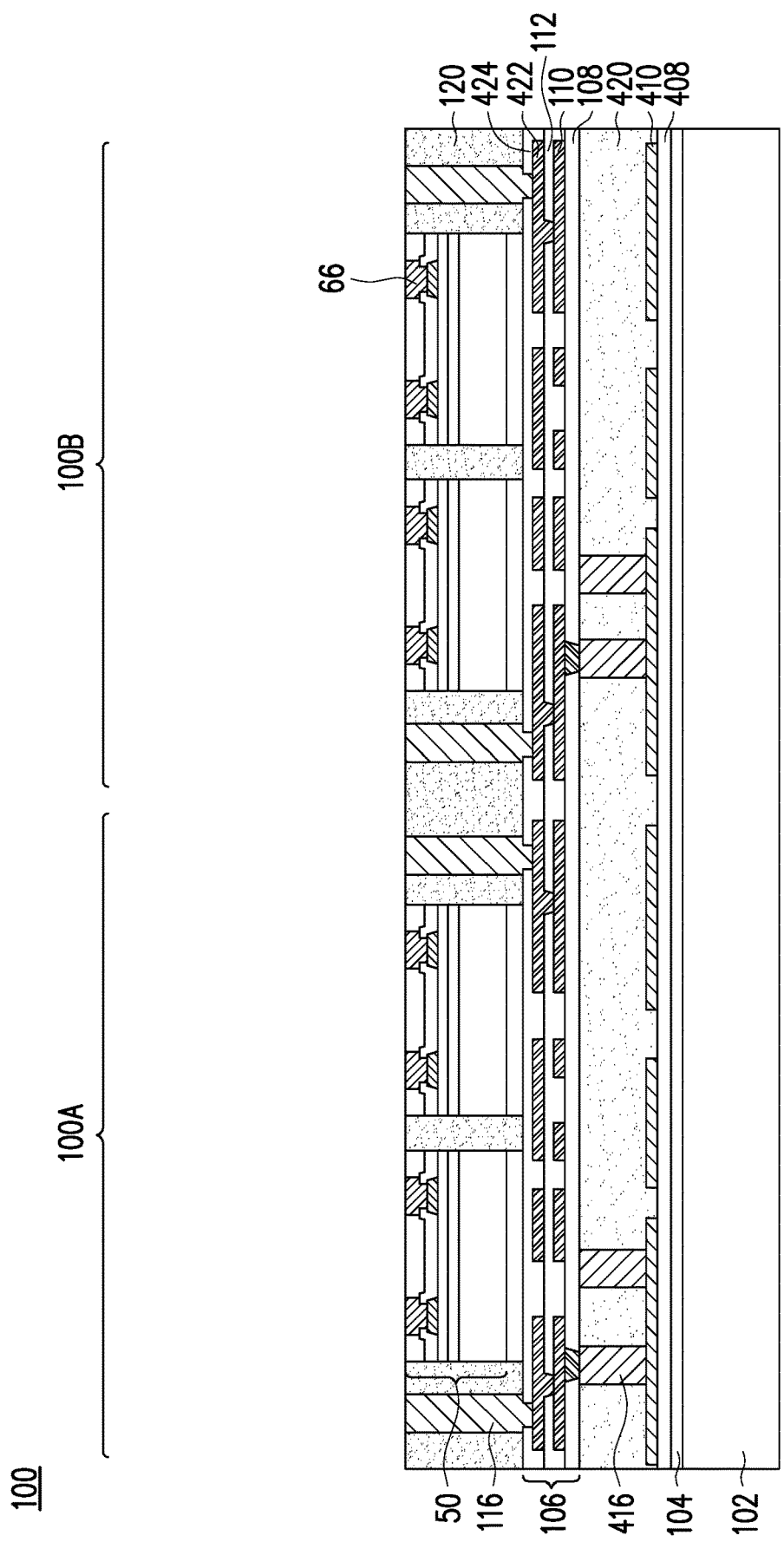

In FIG. 16, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and/or die connectors 66 are already exposed.

In FIGS. 17 through 20, a front-side redistribution structure 122 (see FIG. 20) is formed over the encapsulant 120, through vias 116, and integrated circuit dies 50. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 17:
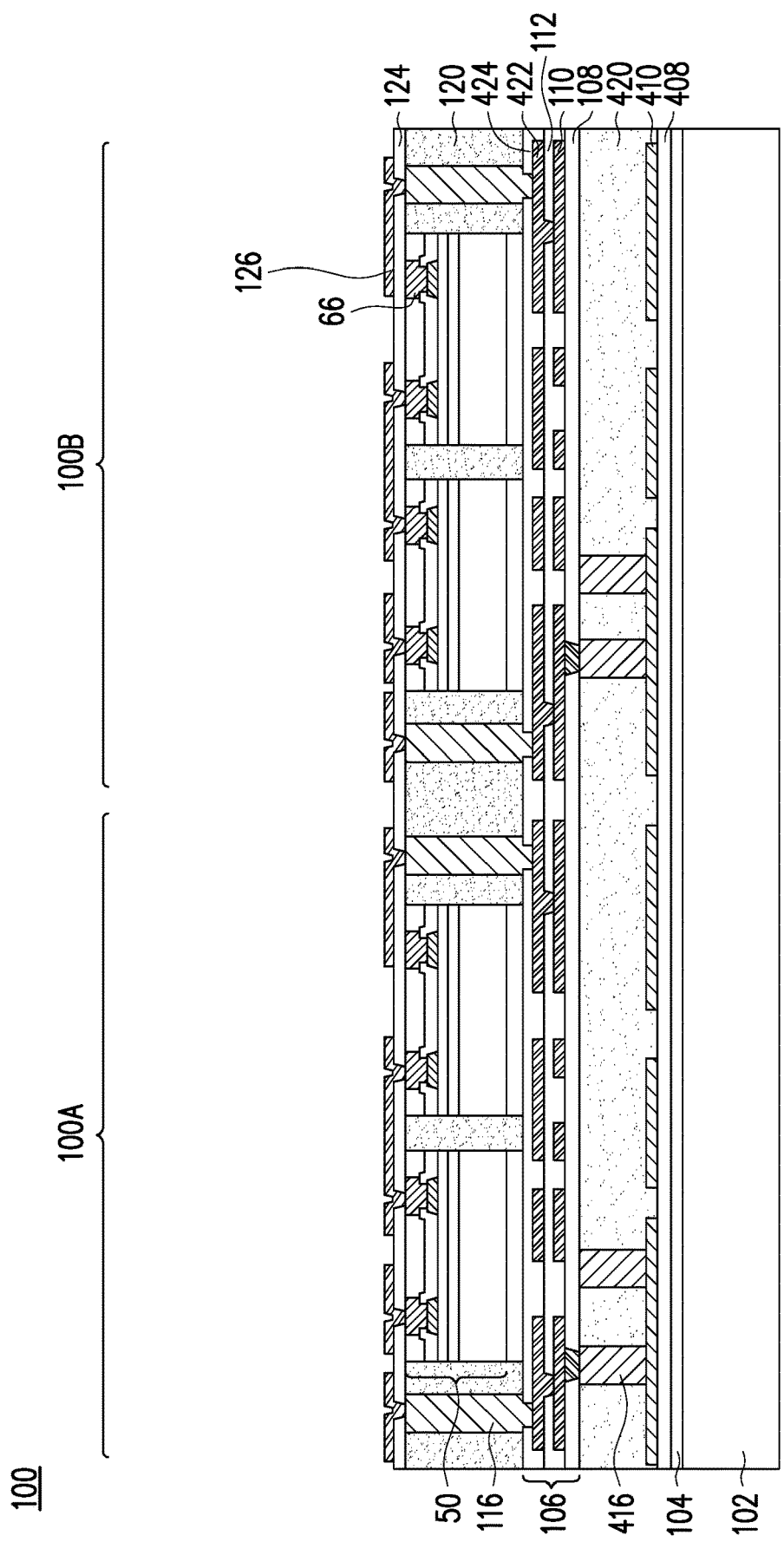

In FIG. 17, the dielectric layer 124 is deposited on the encapsulant 120, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124 to physically and electrically couple to the through vias 116 and the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 18:
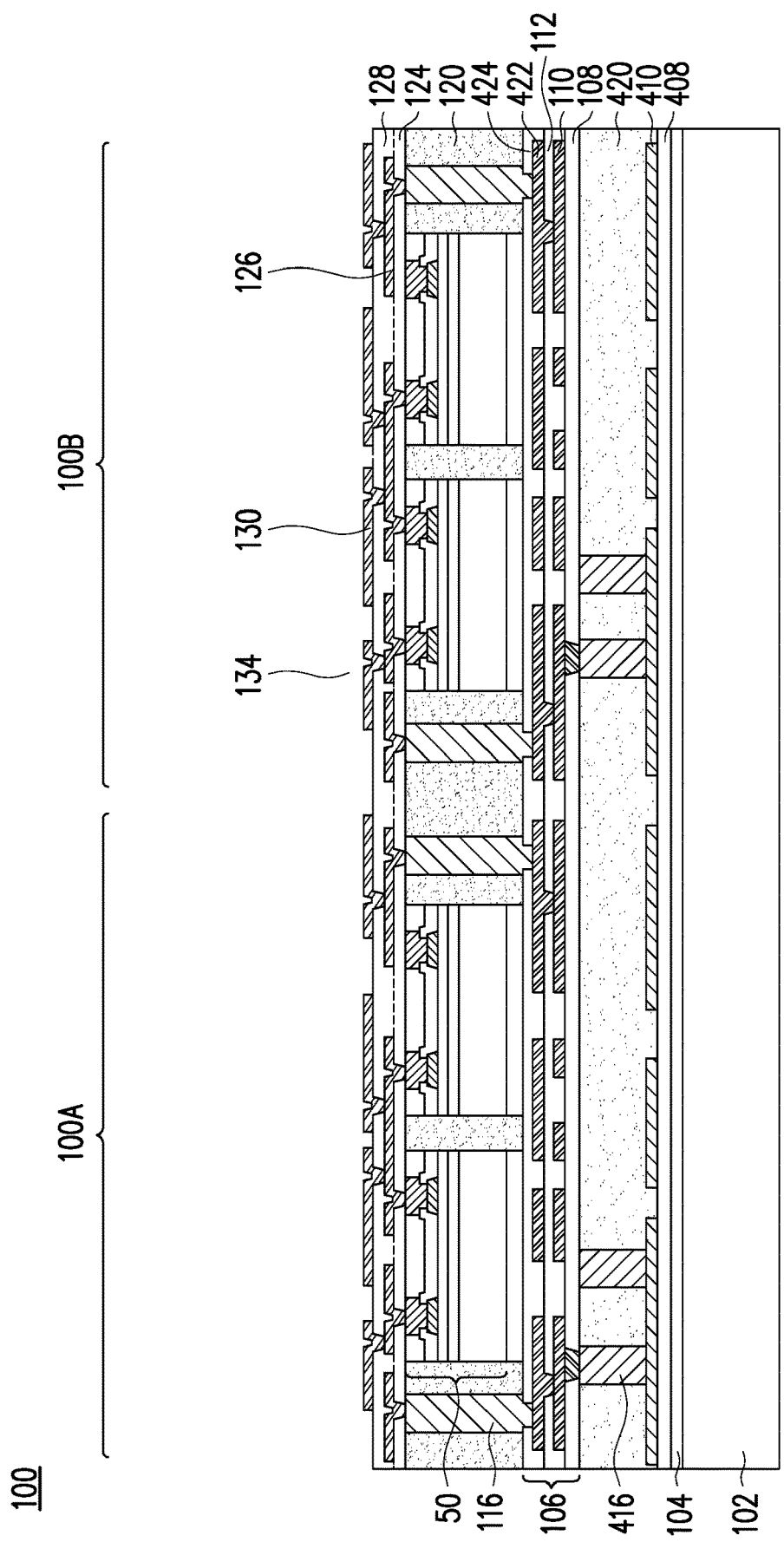

In FIG. 18, the dielectric layer 128 is deposited on the metallization pattern 126 and the dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 19:
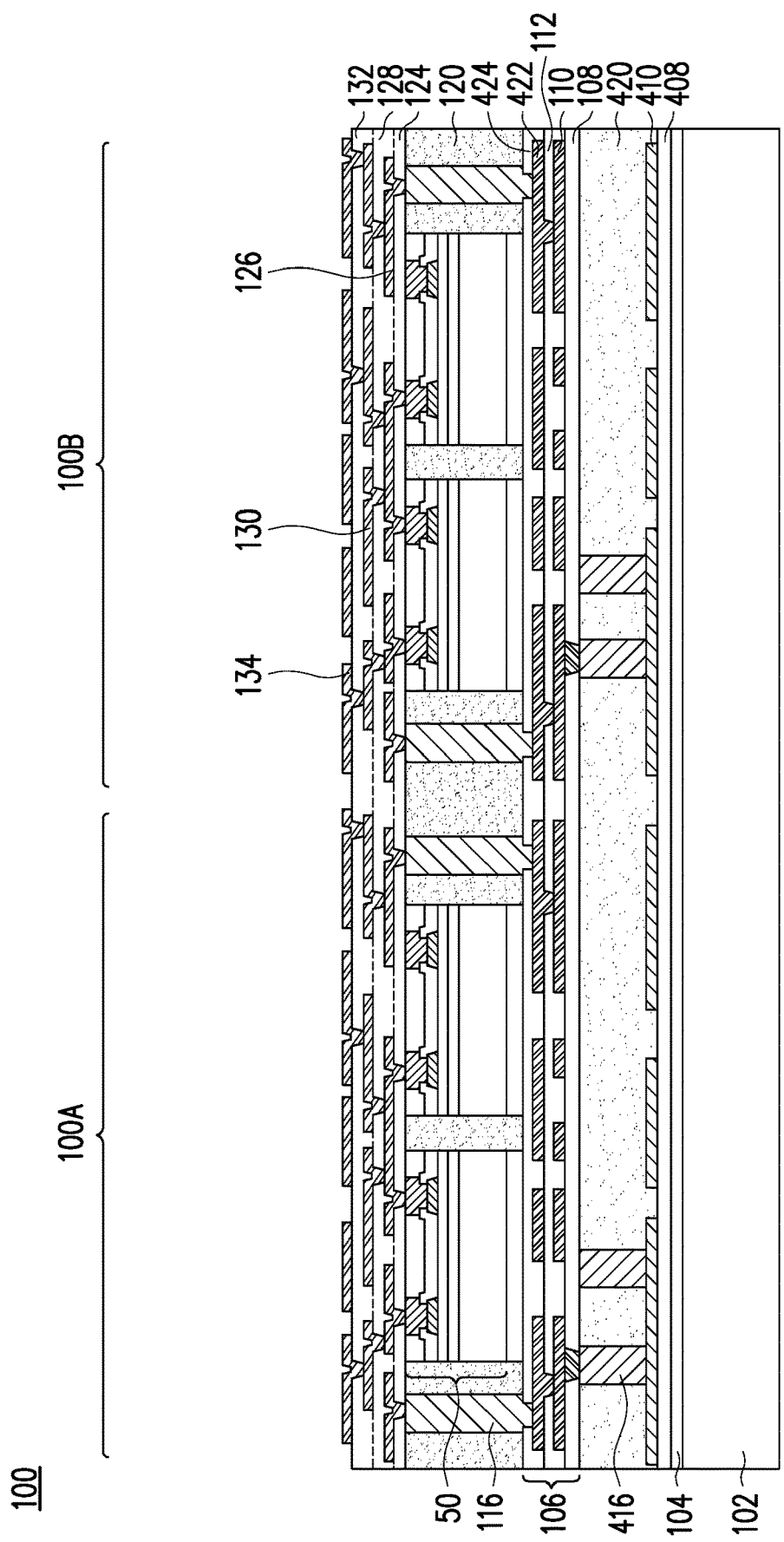

In FIG. 19, the dielectric layer 132 is deposited on the metallization pattern 130 and the dielectric layer 128. The dielectric layer 132 may be formed in a manner similar to the dielectric layer 124, and may be formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 20:
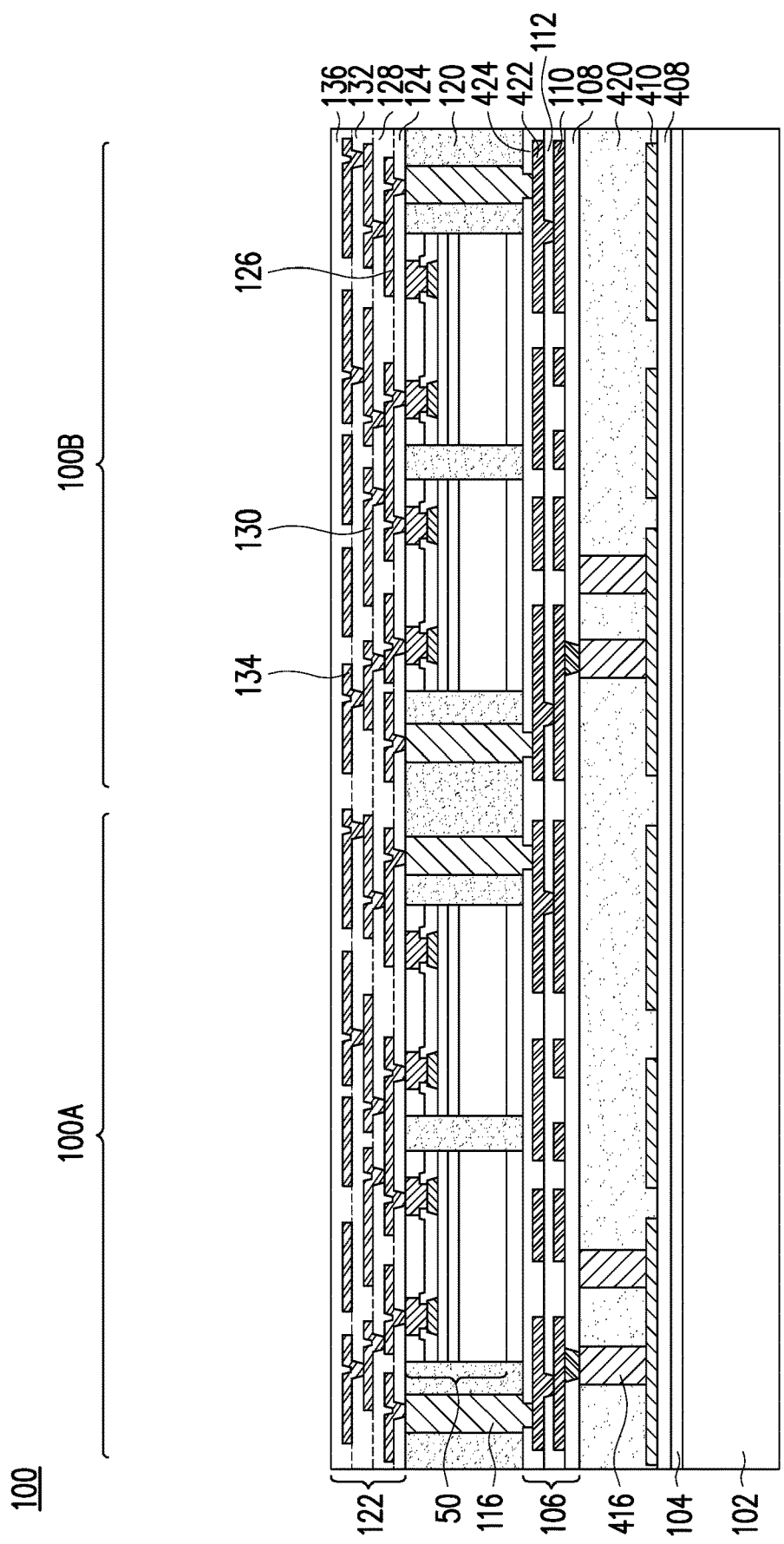

In FIG. 20, the dielectric layer 136 is deposited on the metallization pattern 134 and the dielectric layer 132. The dielectric layer 136 may be formed in a manner similar to the dielectric layer 124, and may be formed of the same material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50. Further, all of the intermediate dielectric layers of the front-side redistribution structure 122 (e.g., the dielectric layers 124, 128, 132) are disposed between the dielectric layer 136 and the integrated circuit dies 50.

Figure 21:
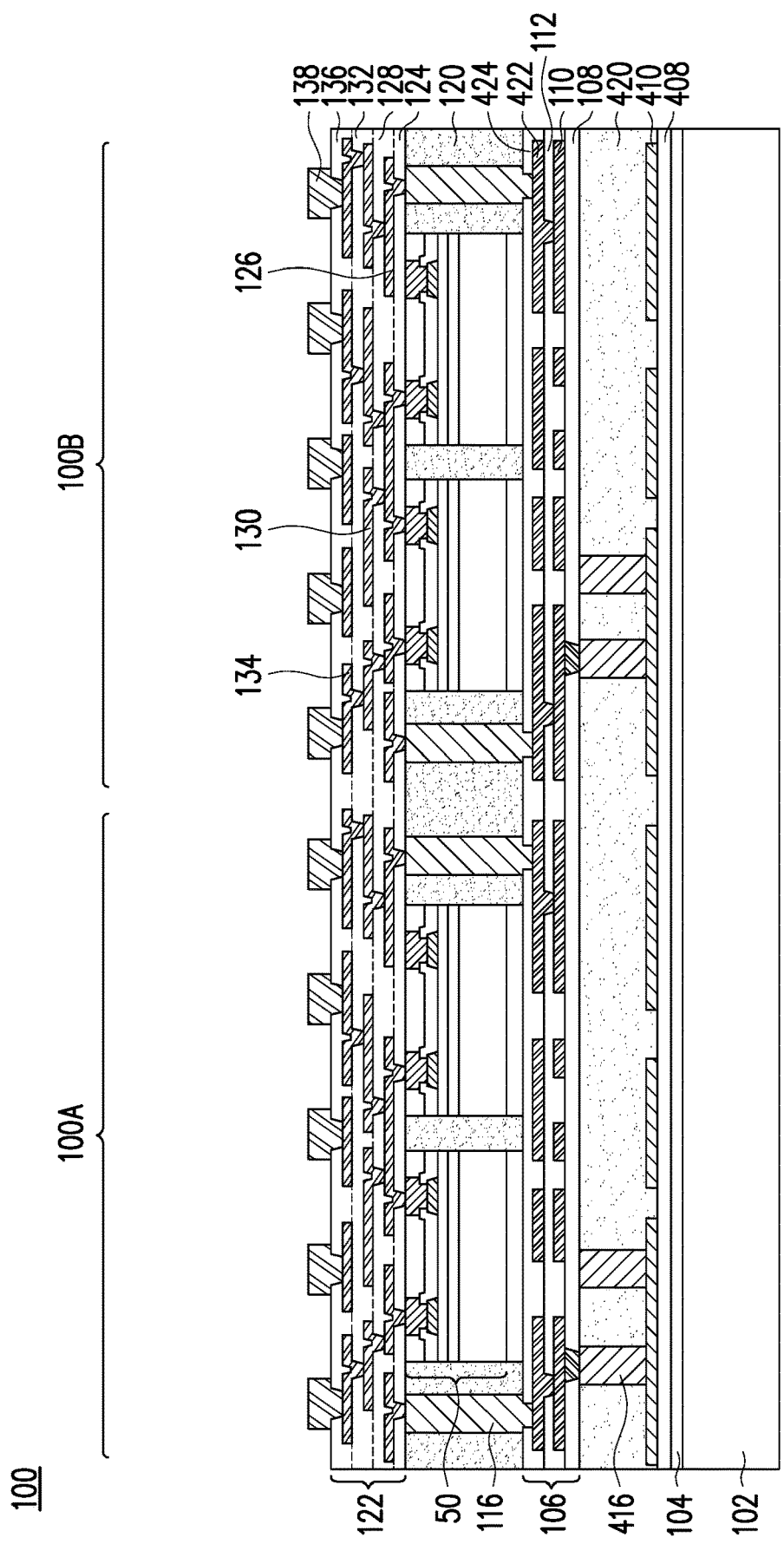

In FIG. 21, UBMs 138 are formed for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the through vias 116 and the integrated circuit dies 50. The UBMs 138 may be formed of the same material as the metallization pattern 126. In some embodiments, the UBMs 138 have a different size than the metallization patterns 126, 130, and 134.

Figure 22:
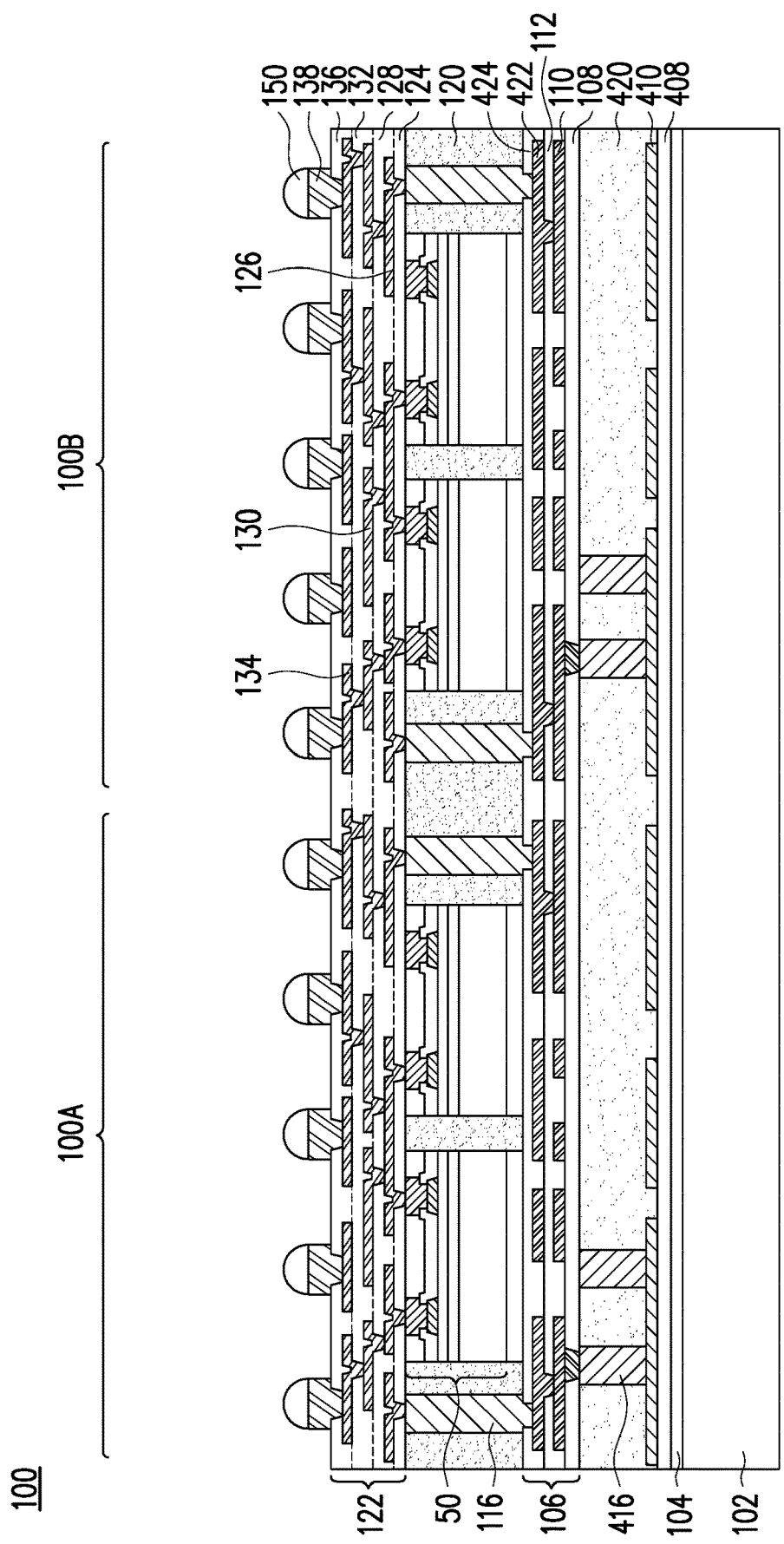

In FIG. 22, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 23:
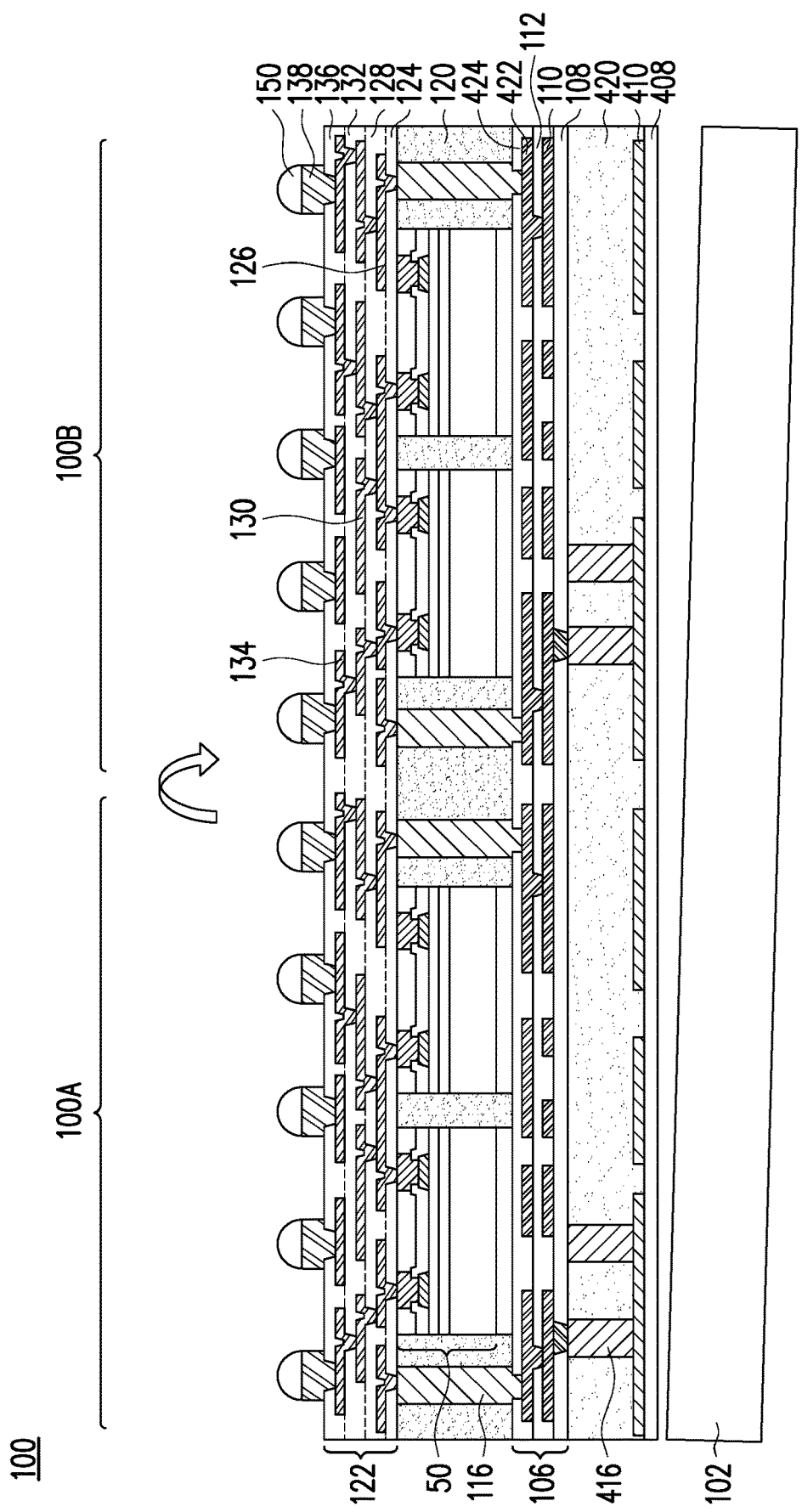

In FIG. 23, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 24:
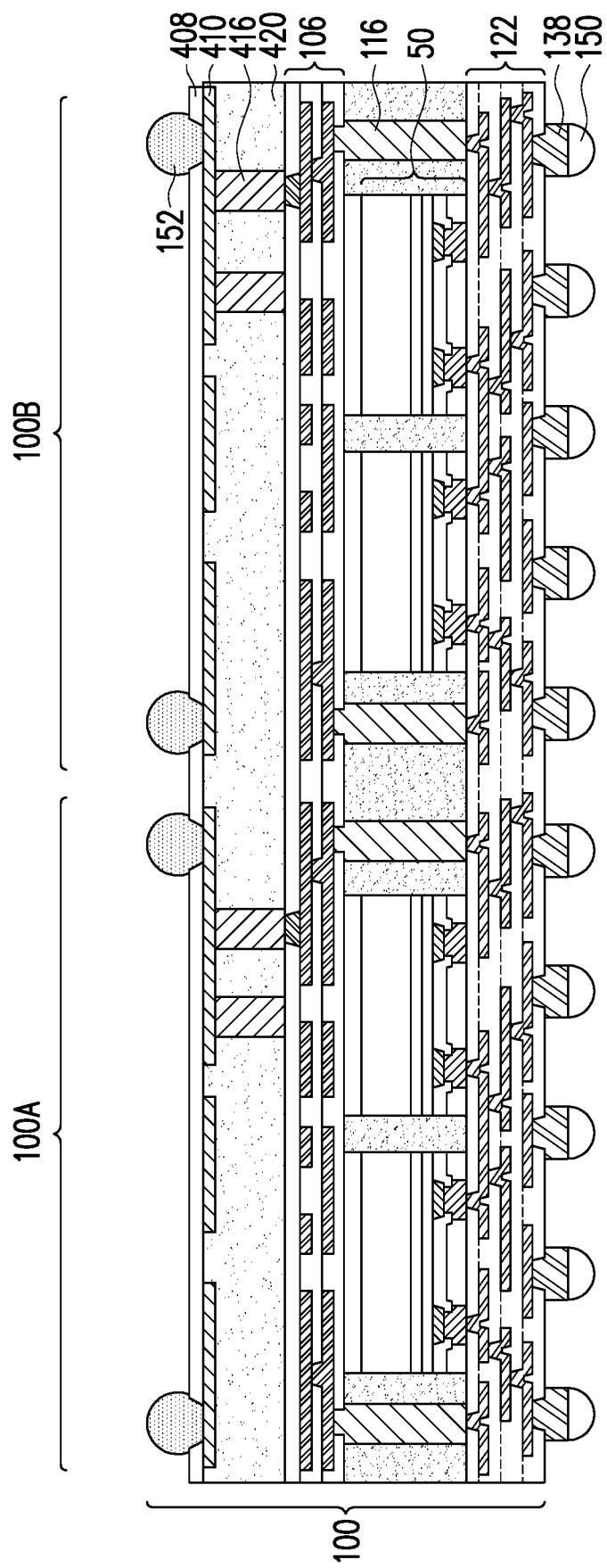

In FIG. 24, conductive connectors 152 are formed extending through the dielectric layer 408 to contact the metallization pattern 410. Openings are formed through the dielectric layer 408 to expose portions of the metallization pattern 410. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 150, and may be formed of a similar material as the conductive connectors 150.

Figure 25:
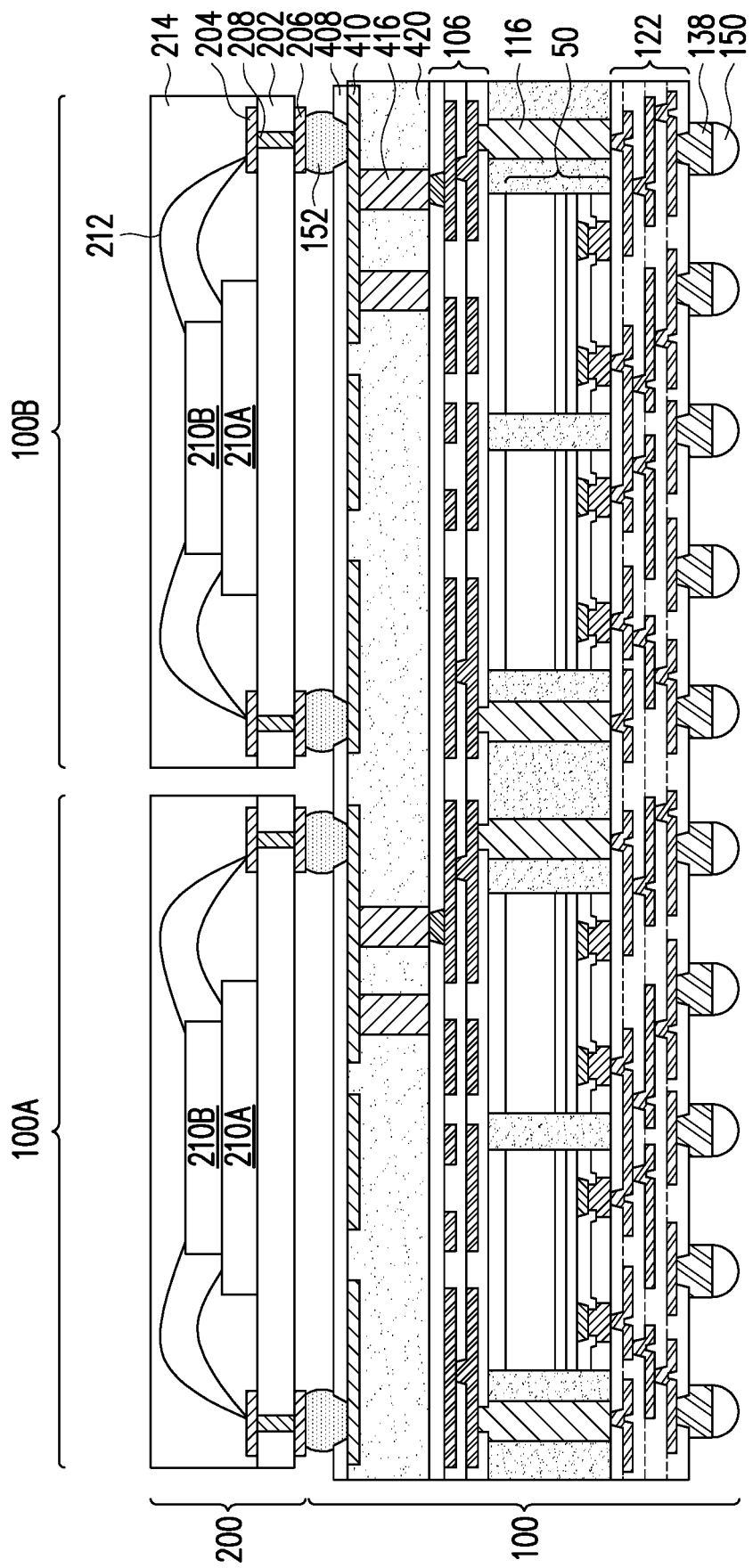
FIGS. 25 and 26 illustrate cross-sectional views of formation and implementation of device stacks in accordance with some embodiments.
Figure 26:
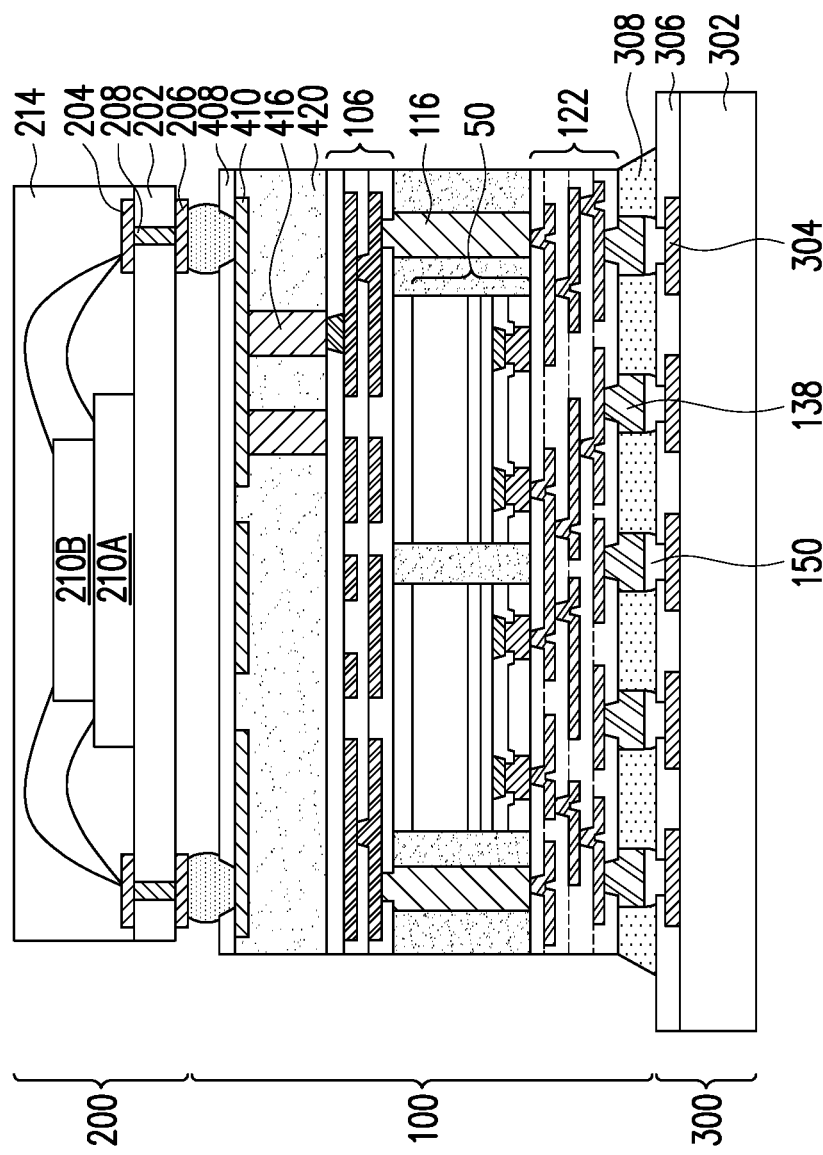

FIGS. 25 and 26 illustrate formation and implementation of device stacks, in accordance with some embodiments. The device stacks are formed from the integrated circuit packages formed in the first package component 100. The device stacks may also be referred to as package-on-package (PoP) structures.

In FIG. 25, second package components 200 are coupled to the first package component 100. One of the second package components 200 is coupled in each of the package regions 100A and 100B to form an integrated circuit device stack in each region of the first package component 100.

The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and a metallization pattern of the back-side redistribution structure 106. In some embodiments, the stacked dies 210 may be coupled to the integrated circuit dies 50A and 50B through the wire bonds 212, the bond pads 204 and 206, the conductive vias 208, the conductive connectors 152, the metallization pattern 410, the through vias 410, the back-side redistribution structure 106, the through vias 116, and the front-side redistribution structure 122.

In some embodiments, a solder resist (not shown) is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux (not shown) formed thereon before they are reflowed with at least some of the epoxy portion of the epoxy flux remaining after the second package components 200 are attached to the first package component 100.

In some embodiments, an underfill (not shown) is formed between the first package component 100 and the second package components 200, surrounding the conductive connectors 152. The underfill may reduce stress and protect the joints resulting from the reflowing of the conductive connectors 152. The underfill may be formed by a capillary flow process after the second package components 200 are attached, or may be formed by a suitable deposition method before the second package components 200 are attached. In embodiments where the epoxy flux is formed, it may act as the underfill.

In FIG. 26, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments (not shown), the singulation process is performed before the second package components 200 are coupled to the first package component 100, such as after the carrier substrate 102 is de-bonded and the conductive connectors 152 are formed.

Each singulated first package component 100 may then be mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate core 202 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the package component 100 prior to mounting the first package component 100 on the package substrate 300, or may be attached to the package substrate 300 prior to or after mounting the first package component 100 on the package substrate 300.

The first package component 100 may be implemented in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the metallization pattern 410, the through vias 410, the back-side redistribution structure 106, and the through vias 116 may also be omitted.

While a polymer material forming and patterning process is described as one possible embodiment to form and pattern the dielectric layer 108, the example of the polymer material forming and pattern process for the dielectric layer 108 is intended to be illustrative and is not intended to be limiting. Rather, the polymer material forming and patterning process may be used for any suitable dielectric layer that is formed and/or patterned, such as e.g. the dielectric layer 408 as described above with respect to FIG. 3 and the dielectric layer 124 of the front-side redistribution structure 122 as described above with respect to FIG. 20. All such processes are fully intended to be included within the scope of the embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. A polymer material such as a low temperature cured polyimide may be used to form dielectric layers of devices, such as integrated fan-out (InFO) packages. The dissipation factor (Df) of the polymer material may be lowered by using polyimide backbones with fewer imide rings, which may be useful for reducing device insertion loss. The polyimide backbones may reduce stress of solder joints to the substrate, such as at die corners, due to having a higher Young's modulus. The polymer material may provide a lower coefficient of thermal expansion and higher adhesion, which may be useful for reducing broken conductive lines and decreasing resultant yield loss. The polymer material may be developed at a lower exposure energy, which may be useful for achieving higher resolution of critical dimensions such as widths of conductive features in redistribution layers. The polymer material may be developed over shorter time intervals, which may be useful for increasing throughput.

In accordance with an embodiment, a method of manufacturing a semiconductor device includes placing a polymer material over a substrate, patterning the polymer material; and curing the polymer material at a temperature in a range of 200° C. to 300° C. The polymer material includes a polymer precursor, the polymer precursor including

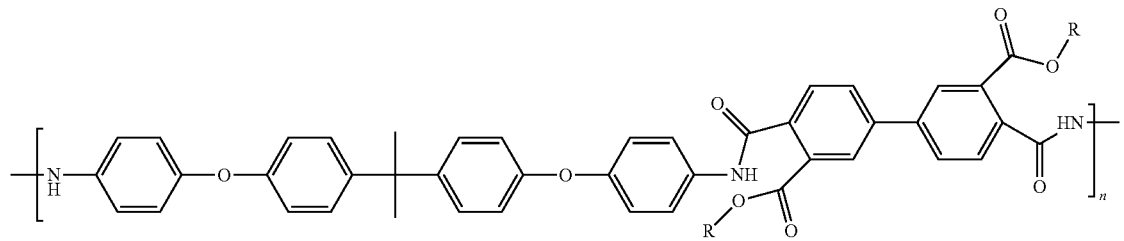

wherein R represents

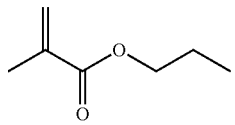

a photosensitizer, and a solvent. In an embodiment, the polymer material includes the polymer precursor in a range of 20% to 40% by weight. In an embodiment, the polymer material includes the photosensitizer in a range of 1% to 8% by weight. In an embodiment, the photosensitizer includes a dibenzoylmethane. In an embodiment, the photosensitizer includes 2,2'-(Phenylimino)diethanol. In an embodiment, the polymer material further includes a cross-linker in a range of 1% to 5% by weight. In an embodiment, the cross-linker includes tetraethylene glycol dimethacrylate. In an embodiment, the solvent includes 1-Methyl-2-pyrrolidone (NMP), the polymer material including NMP in a range of 45% to 55% by weight. In an embodiment, the solvent includes ethyl lactate (EL), the polymer material including EL in a range of 10% to 15% by weight.

In accordance with another embodiment, a method of manufacturing a semiconductor device includes: forming a polymer precursor, forming a polymer mixture, the polymer mixture including the polymer precursor and a solvent, applying the polymer mixture over a substrate, exposing and developing at least a portion of the polymer mixture to form a developed dielectric, curing the developed dielectric to form a dielectric layer, and forming a conductive feature over the dielectric layer. The forming the polymer precursor includes reacting 3,3,4,4-biphenyltetracarboxylic dianhydride with a first reactant to form a second reactant and reacting the second reactant with 4,4-(4,4-isopropylidenediphenyl-1,1-diyldioxy)dianiline (BAPP) to form the polymer precursor. In an embodiment, the polymer mixture further includes a cross-linker. In an embodiment, during the exposing and developing at least the portion of the polymer mixture, the cross-linker reacts with the polymer precursor to form a cross-linked polymer chain. In an embodiment, the curing the dielectric layer includes a thermal cure, the thermal cure converting the cross-linked polymer chain to a polyimide with the following structure

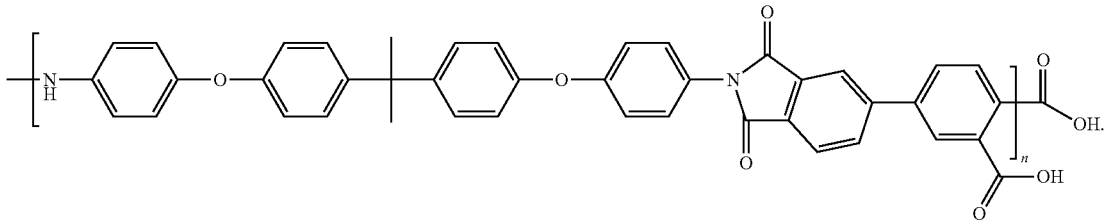

In an embodiment, the dielectric layer has a dissipation factor in a range of 0.007 to 0.01 at about 60 GHz. In an embodiment, the dielectric layer has a Young's modulus in a range of 3.7 GPa to 3.8 GPa. In an embodiment, the dielectric layer has a dielectric constant of about 2.9. In an embodiment, the dielectric layer has a tensile strength in a range of 157 MPa to 181 MPa.

In accordance with yet another embodiment, a semiconductor package includes: a first encapsulant on a first dielectric layer, the first encapsulant encapsulating a first through via, and a first redistribution structure over the first encapsulant and the first through via. The first redistribution structure includes: a second dielectric layer, the second dielectric layer having a dissipation factor in a range of 0.007 to 0.01 at 60 GHz and having a Young's modulus in a range of 3.7 GPa to 3.8 GPa, and a first metallization pattern on the second dielectric layer, the first metallization pattern physically and electrically coupling the first through via. In an embodiment, the semiconductor package further includes: a die on the first redistribution structure, a second through via on the first redistribution structure, a second encapsulant on the first redistribution structure, the second encapsulant encapsulating the die and the second through via, and a second redistribution structure over the second encapsulant, the die, and the second through via. The second redistribution structure includes: a third dielectric layer, and a second metallization pattern on the third dielectric layer, the second metallization pattern physically and electrically coupling the die and the second through via. In an embodiment, the second dielectric layer includes the following structure

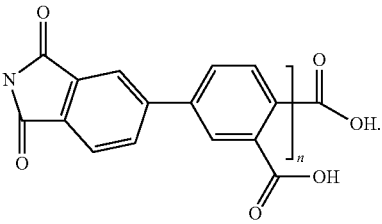

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    placing a polymer material over a substrate, the polymer material comprising:
        a polymer precursor, the polymer precursor comprising the following structure

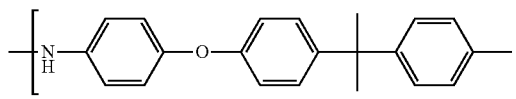

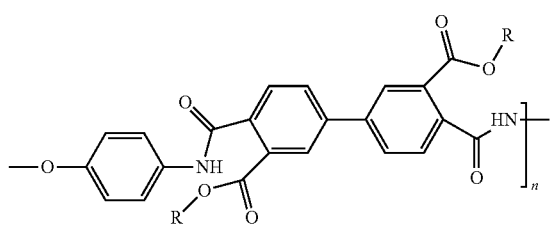

wherein n outside the brackets represents a number of the repeating unit of the structure, and wherein R represents

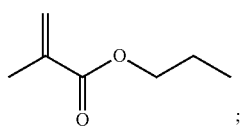

a photosensitizer; and
a solvent;
patterning the polymer material; and
curing the polymer material at a temperature in a range of 200° C. to 300° C.

2. The method of claim 1, wherein the polymer material comprises the polymer precursor in a range of 20% to 40% by weight.

3. The method of claim 1, wherein the polymer material comprises the photosensitizer in a range of 1% to 8% by weight.

4. The method of claim 3, wherein the photosensitizer comprises a dibenzoylmethane.

5. The method of claim 3, wherein the photosensitizer comprises 2,2'-(Phenylimino)diethanol.

6. The method of claim 1, wherein the polymer material further comprises a cross-linker in a range of 1% to 5% by weight.

7. The method of claim 6, wherein the cross-linker comprises tetraethylene glycol dimethacrylate.

8. The method of claim 1, wherein the solvent comprises 1-Methyl-2-pyrrolidone (NMP), the polymer material comprising NMP in a range of 45% to 55% by weight.

9. The method of claim 8, wherein the solvent comprises ethyl lactate (EL), the polymer material comprising EL in a range of 10% to 15% by weight.

10. A method of manufacturing a semiconductor device, the method comprising:
    forming a polymer precursor, the forming of the polymer precursor comprising:
        reacting 3,3,4,4-biphenyltetracarboxylic dianhydride with a first reactant to form a second reactant; and
        reacting the second reactant with 4,4-(4,4-isopropylidenediphenyl-1,1-diyldioxy)dianiline (BAPP) to form the polymer precursor;
    forming a polymer mixture, the polymer mixture comprising the polymer precursor and a solvent;
    applying the polymer mixture over a substrate;
    exposing and developing at least a portion of the polymer mixture to form a developed dielectric;
    curing the developed dielectric to form a dielectric layer; and
    forming a conductive feature over the dielectric layer.

11. The method of claim 10, wherein the polymer mixture further comprises a cross-linker.

12. The method of claim 11, wherein during the exposing and developing at least the portion of the polymer mixture, the cross-linker reacts with the polymer precursor to form a cross-linked polymer chain.

13. The method of claim 12, wherein the curing the dielectric layer comprises a thermal cure, the thermal cure converting the cross-linked polymer chain to a polyimide with the following structure

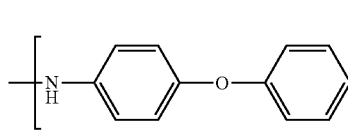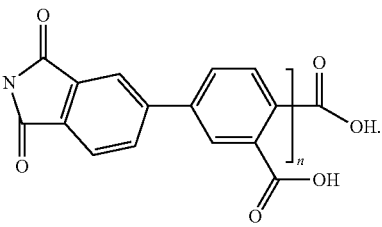

wherein n outside the brackets represents a number of the repeating unit of the structure.

14. The method of claim 10, wherein the dielectric layer has a dissipation factor in a range of 0.007 to 0.01 at about 60 GHz.

15. The method of claim 10, wherein the dielectric layer has a Young's modulus in a range of 3.7 GPa to 3.8 GPa.

16. The method of claim 10, wherein the dielectric layer has a dielectric constant of about 2.9.

17. The method of claim 10, wherein the dielectric layer has a tensile strength in a range of 157 MPa to 181 MPa.

18. A method of manufacturing a semiconductor device, the method comprising:
forming a first encapsulant on a first dielectric layer, the first encapsulant encapsulating a first through via; and
forming a first redistribution structure over the first encapsulant and the first through via, the forming of the first redistribution structure comprising:
forming a second dielectric layer, the second dielectric layer having a dissipation factor in a range of 0.007 to 0.01 at 60 GHz and having a Young's modulus in a range of 3.7 GPa to 3.8 GPa; and
forming a first metallization pattern on the second dielectric layer, the first metallization pattern physically and electrically coupling the first through via.

19. The method of claim 18 further comprising:
bonding a die on the first redistribution structure;
forming a second through via on the first redistribution structure;
forming a second encapsulant on the first redistribution structure, the second encapsulant encapsulating the die and the second through via; and
forming a second redistribution structure over the second encapsulant, the die, and the second through via, the forming of the second redistribution structure comprising:
forming a third dielectric layer; and
forming a second metallization pattern on the third dielectric layer, the second metallization pattern physically and electrically coupling the die and the second through via.

20. The method of claim 18, wherein the second dielectric layer comprises the following structure

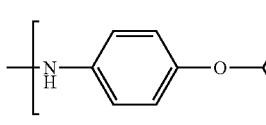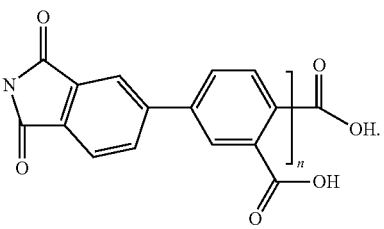

wherein n outside the brackets represents a number of the repeating unit of the structure.

\* \* \* \* \*

UNITED STATES PATENT AND TRADEMARK OFFICE
CERTIFICATE OF CORRECTION

PATENT NO. : 11,868,047 B2
APPLICATION NO. : 17/026667
DATED : January 9, 2024
INVENTOR(S) : Liao et al.

It is certified that error appears in the above-identified patent and that said Letters Patent is hereby corrected as shown below:

In the Claims

In Column 34, in Claim 13, Line 5 (approx.), delete "OH." and insert -- OH --.

In Column 34, in Claim 20, Line 40 (approx.), delete "OH." and insert -- OH --.

Signed and Sealed this
Ninth Day of April, 2024

Katherine Kelly Vidal
*Director of the United States Patent and Trademark Office*